United States Patent
Chuang et al.

(10) Patent No.: US 11,088,083 B2
(45) Date of Patent: Aug. 10, 2021

(54) DC AND AC MAGNETIC FIELD PROTECTION FOR MRAM DEVICE USING MAGNETIC-FIELD-SHIELDING STRUCTURE

(71) Applicant: Taiwan Semiconductor Manufacturing Co., Ltd., Hsin-Chu (TW)

(72) Inventors: Harry-Hak-Lay Chuang, Zhubei (TW); Tien-Wei Chiang, Taipei (TW); Kuo-An Liu, Hsinchu (TW); Chia-Hsiang Chen, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/381,410

(22) Filed: Apr. 11, 2019

(65) Prior Publication Data
US 2020/0006245 A1    Jan. 2, 2020

Related U.S. Application Data

(60) Provisional application No. 62/692,238, filed on Jun. 29, 2018.

(51) Int. Cl.
*H01L 27/22* (2006.01)
*H01L 23/552* (2006.01)
(Continued)

(52) U.S. Cl.
CPC ...... *H01L 23/552* (2013.01); *H01L 23/49555* (2013.01); *H01L 24/48* (2013.01);
(Continued)

(58) Field of Classification Search
CPC ........... H01L 27/222; H01L 2924/1443; H01L 2924/3025; H01L 43/02; H01L 43/12
See application file for complete search history.

(56) References Cited

U.S. PATENT DOCUMENTS

| | | | |
|---|---|---|---|
| 5,989,406 A | 11/1999 | Beetz, Jr. et al. | |
| 7,336,556 B2 | 2/2008 | Okayama et al. | |

(Continued)

FOREIGN PATENT DOCUMENTS

| | | |
|---|---|---|
| CN | 104853576 A | 8/2015 |
| CN | 108074825 A | 5/2018 |

(Continued)

OTHER PUBLICATIONS

U.S. Appl. No. 16/379,901, filed Apr. 10, 2019.
(Continued)

*Primary Examiner* — Jaehwan Oh
(74) *Attorney, Agent, or Firm* — Eschweiler & Potashnik, LLC

(57) ABSTRACT

In some embodiments, the present application provides a memory device. The memory device includes a chip that includes a magnetic random access memory (MRAM) cell. A magnetic-field-shielding structure at least partially surrounding the chip including a multilayer stack. The multilayer stack includes a magnetic layer and a dielectric layer. A first magnetic region is located inside an inner surface of the magnetic field shielding structure and a second magnetic region is located immediately outside an outer surface of the magnetic field shielding structure. A magnetic field in the first magnetic region is less than a magnetic field in the second magnetic region.

20 Claims, 18 Drawing Sheets

(51) Int. Cl.
  *H01L 43/02* (2006.01)
  *H01L 43/12* (2006.01)
  *H01L 23/495* (2006.01)
  *H01L 23/00* (2006.01)
(52) U.S. Cl.
  CPC ............ *H01L 24/49* (2013.01); *H01L 27/222* (2013.01); *H01L 43/02* (2013.01); *H01L 43/12* (2013.01); *H01L 2224/48091* (2013.01); *H01L 2224/48106* (2013.01); *H01L 2224/48247* (2013.01); *H01L 2224/49176* (2013.01); *H01L 2924/1443* (2013.01); *H01L 2924/3025* (2013.01)

(56) References Cited

U.S. PATENT DOCUMENTS

| | | | |
|---|---|---|---|
| 7,598,596 | B2 | 10/2009 | Molla et al. |
| 9,048,413 | B2 | 6/2015 | Zeng |
| 10,588,250 | B2 | 3/2020 | Woo et al. |
| 2004/0058138 | A1 | 3/2004 | Inazawa et al. |
| 2005/0089708 | A1 | 4/2005 | Maruko et al. |
| 2005/0226030 | A1* | 10/2005 | Kato .................... H01L 23/552 365/154 |
| 2005/0230788 | A1* | 10/2005 | Kato .................... H01L 23/552 257/659 |
| 2006/0180880 | A1* | 8/2006 | Wang .................... H01L 23/552 257/414 |
| 2006/0289970 | A1 | 12/2006 | Gogl et al. |
| 2007/0103967 | A1 | 5/2007 | Boeve |
| 2008/0122047 | A1* | 5/2008 | Honer .................... H01L 27/222 257/660 |
| 2009/0122597 | A1* | 5/2009 | Sugibayashi ......... H01L 27/228 365/158 |
| 2010/0072566 | A1 | 3/2010 | Kang et al. |
| 2010/0164077 | A1* | 7/2010 | Bando .............. H01L 23/49503 257/659 |
| 2010/0270660 | A1* | 10/2010 | Masuda ................. H01L 23/16 257/659 |
| 2011/0304015 | A1* | 12/2011 | Kim ...................... H01L 25/105 257/532 |
| 2012/0051122 | A1 | 3/2012 | Tsuji et al. |
| 2014/0015116 | A1 | 1/2014 | Fu et al. |
| 2014/0042568 | A1* | 2/2014 | Yamakawa ............. H01L 43/12 257/421 |
| 2015/0084141 | A1 | 3/2015 | Fujimori |
| 2016/0093795 | A1* | 3/2016 | Arai ...................... H01L 23/552 257/422 |
| 2016/0172580 | A1 | 6/2016 | Matsubara |
| 2016/0322562 | A1 | 11/2016 | Jang et al. |
| 2016/0381843 | A1* | 12/2016 | Ozaki ..................... H01F 27/36 335/216 |
| 2017/0025361 | A1 | 1/2017 | Lee et al. |
| 2017/0047507 | A1 | 2/2017 | Seo et al. |
| 2017/0077390 | A1 | 3/2017 | Otsuka |

FOREIGN PATENT DOCUMENTS

| | | |
|---|---|---|
| JP | H0529197 A | 2/1993 |
| JP | 2003309196 A | 10/2003 |
| JP | 2016129206 A | 7/2016 |

OTHER PUBLICATIONS

Unknown Author. "SemiConductor—What is SemiConductor?" Computer Notes, published on Apr. 3, 2013.
Komitsky et al. "Die Attach in Lead Frame Packages: Step 4." SolidState Technology. The date of publication is unknown. Retrieved online on Aug. 14, 2018 from https://electroiq.com/2004/04/die-attach-in-lead-frame-packages-step-4/.
Non-Final Office Action dated Feb. 11, 2021 in connection with U.S. Appl. No. 16/379,901.

* cited by examiner

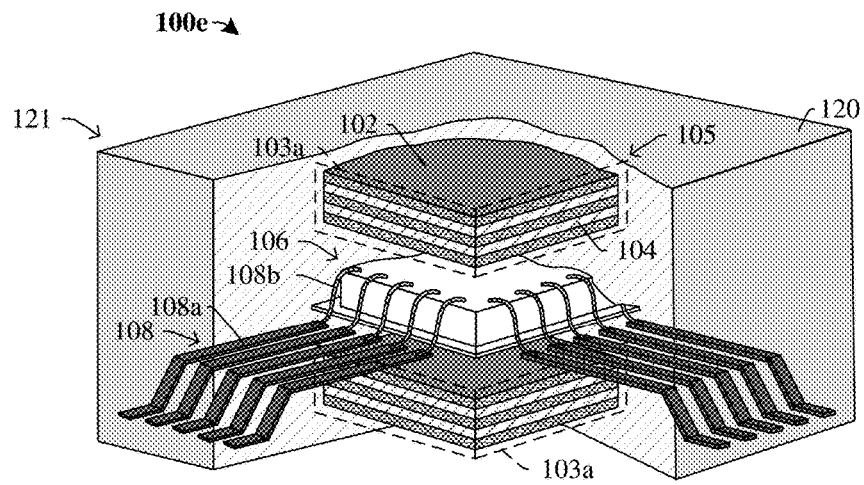
Fig. 1E
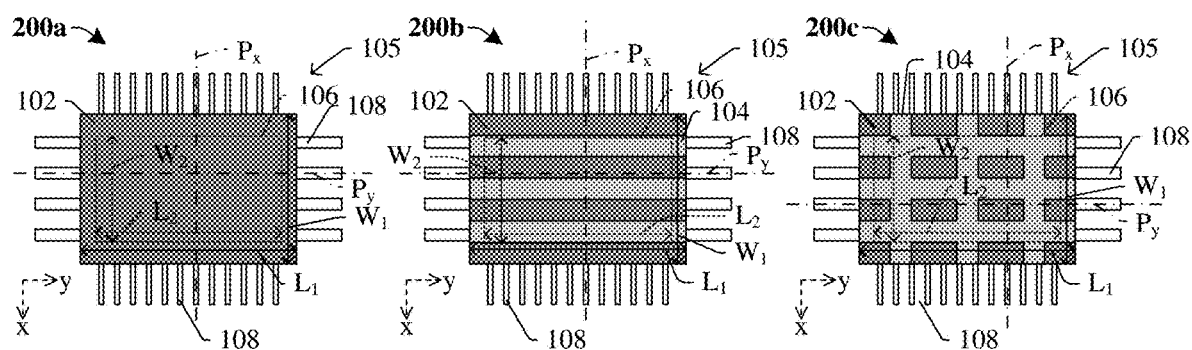
Fig. 2A  Fig. 2B  Fig. 2C

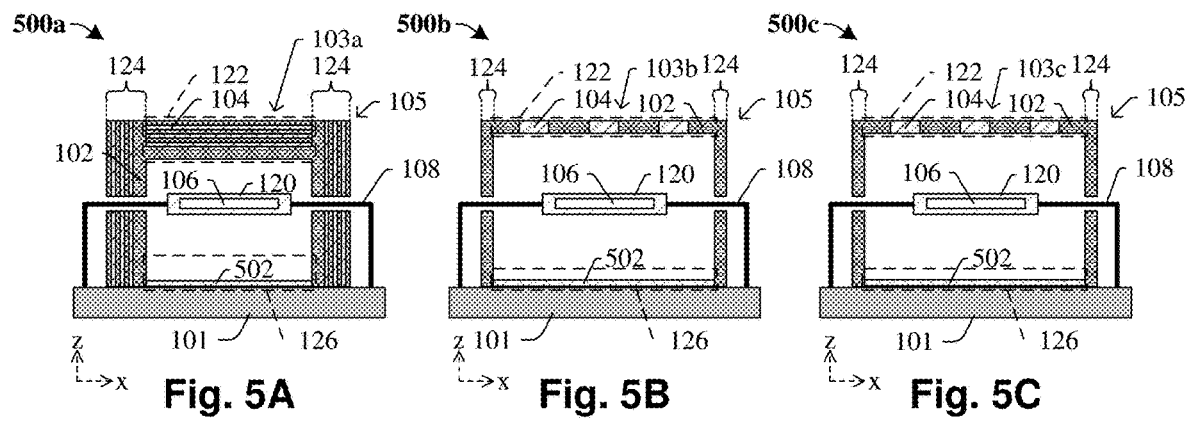
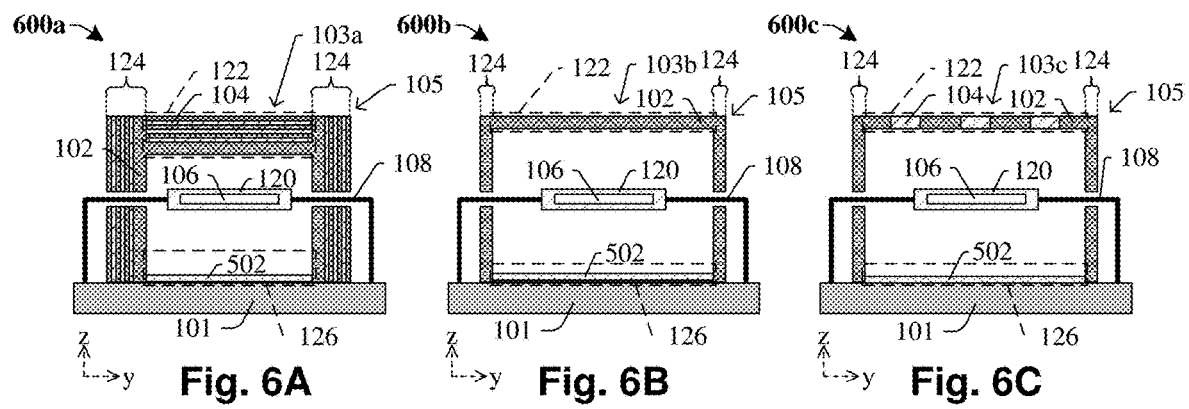
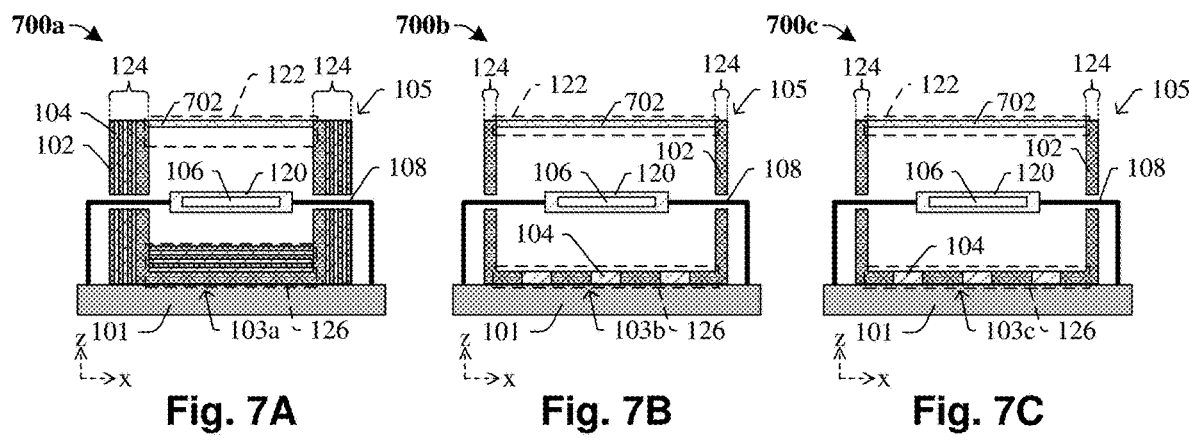

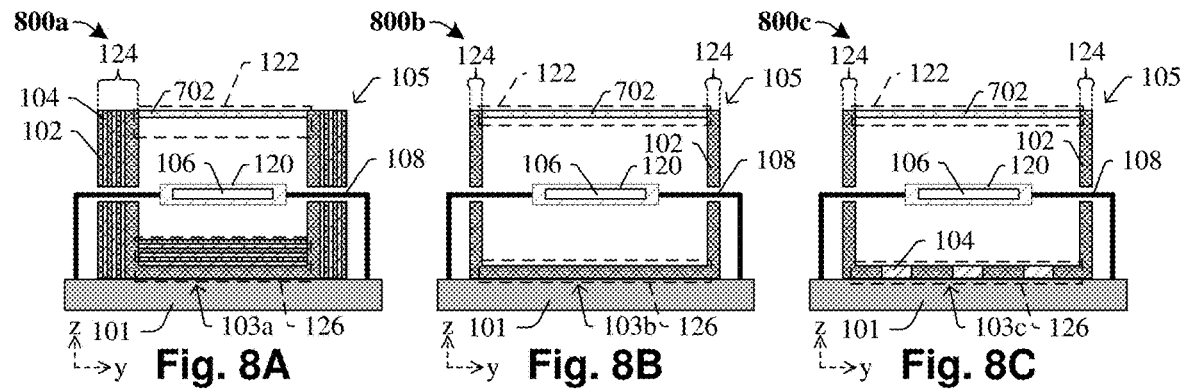
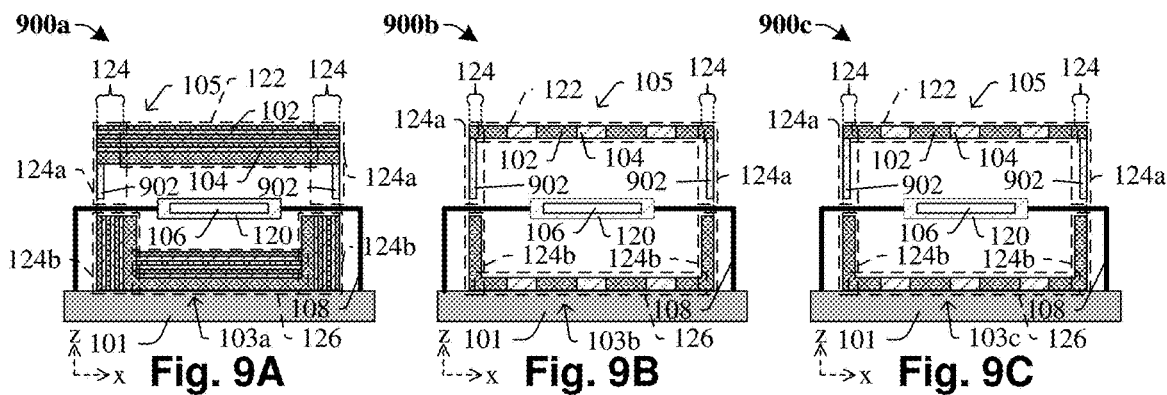
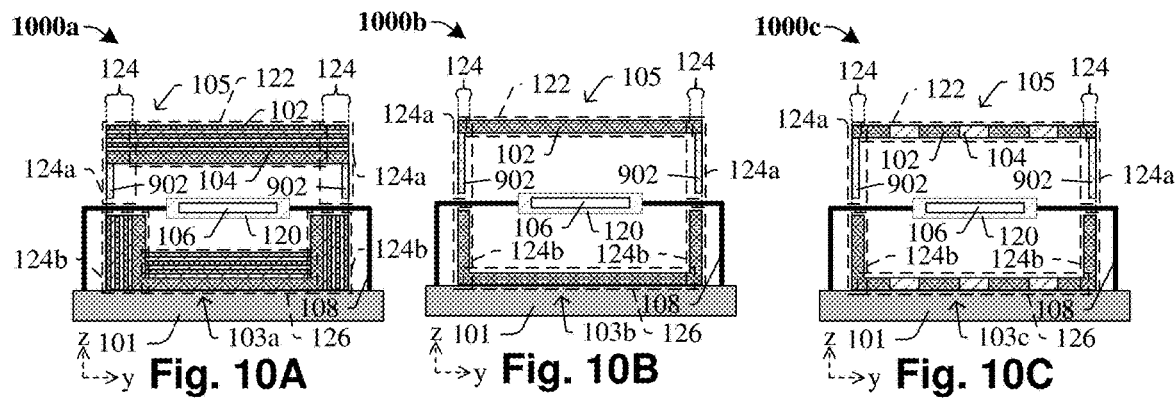

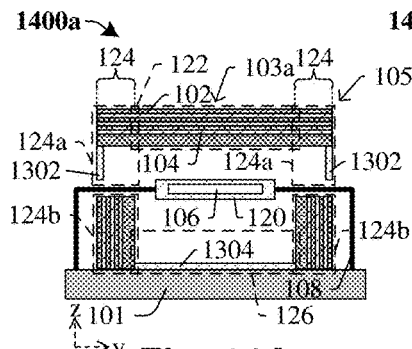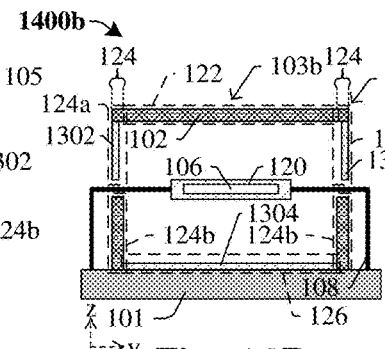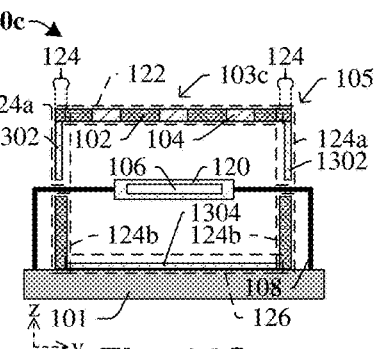
Fig. 14A   Fig. 14B   Fig. 14C
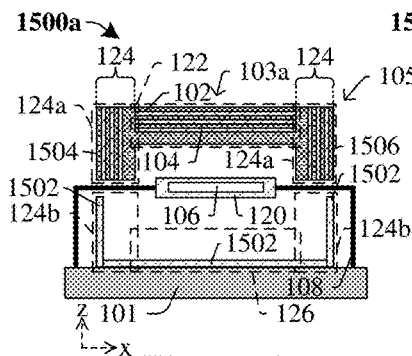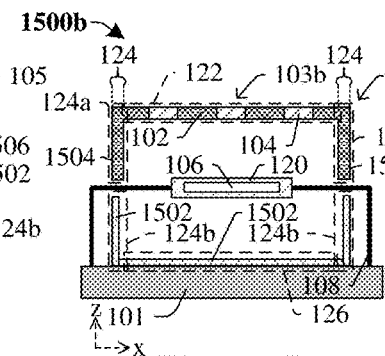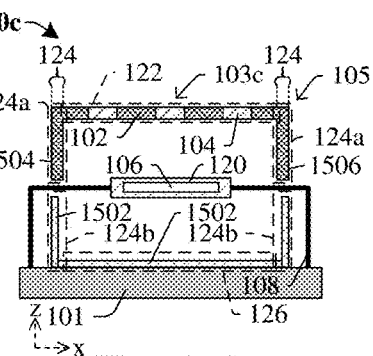
Fig. 15A   Fig. 15B   Fig. 15C
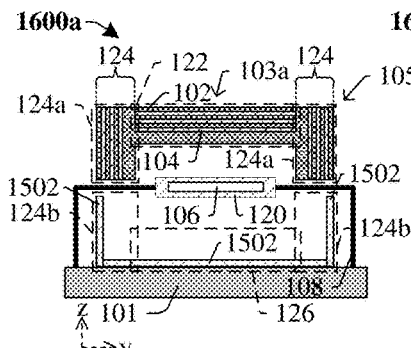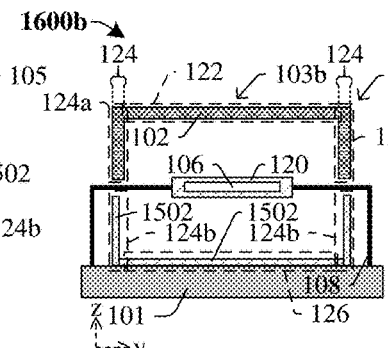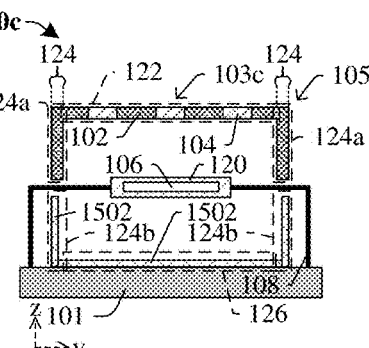
Fig. 16A   Fig. 16B   Fig. 16C

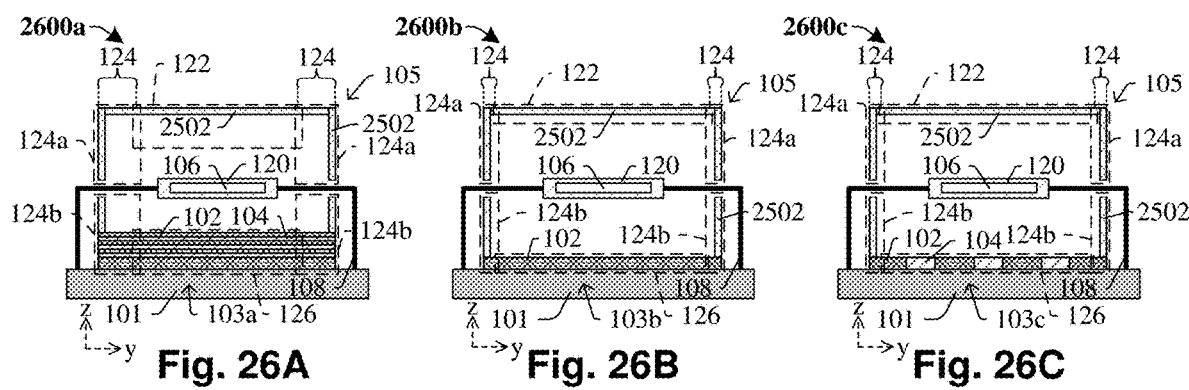

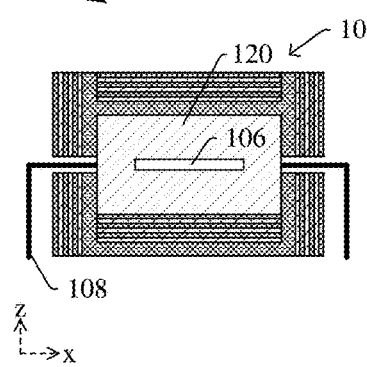 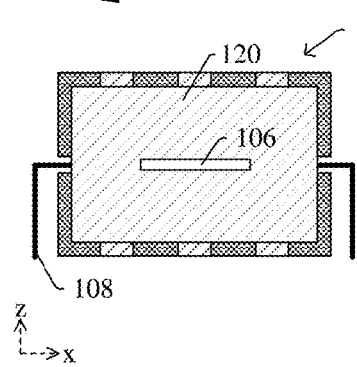 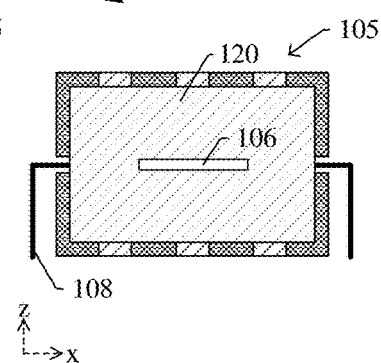
Fig. 35A          Fig. 35B          Fig. 35C
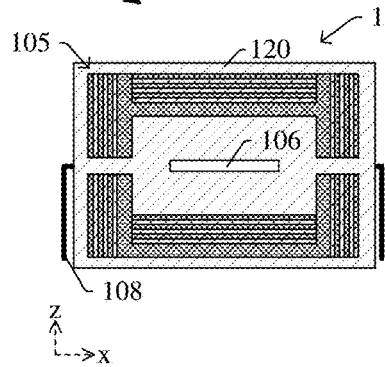 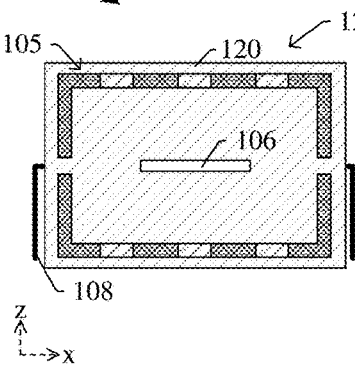 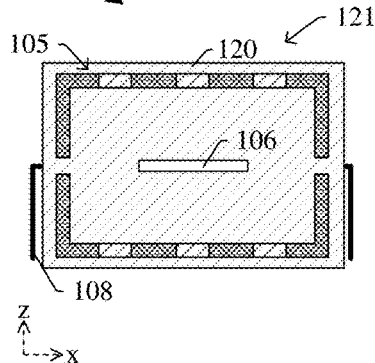
Fig. 36A          Fig. 36B          Fig. 36C

US 11,088,083 B2

DC AND AC MAGNETIC FIELD PROTECTION FOR MRAM DEVICE USING MAGNETIC-FIELD-SHIELDING STRUCTURE

REFERENCE TO RELATED APPLICATION

This Application claims the benefit of U.S. Provisional Application No. 62/692,238, filed on Jun. 29, 2018, the contents of which are hereby incorporated by reference in their entirety.

BACKGROUND

Many modern day electronic devices contain electronic memory, such as hard disk drives or random access memory (RAM). Electronic memory may be volatile memory or non-volatile memory. Non-volatile memory is able to retain its stored data in the absence of power, whereas volatile memory loses its data memory contents when power is lost. Magnetic tunnel junctions (MTJs) can be used in hard disk drives and/or magnetic RAM (MRAM), and thus are promising candidates for next generation memory solutions.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1E illustrates a perspective view of some embodiments of a packaged memory device that comprises a chip and makes use of a magnetic field shielding structure in accordance with some embodiments, with the front portions removed to more clearly depict inner portions of the packaged memory device.

FIGS. 2A-2C depict top views of FIGS. 1A-1C, respectively, including a memory device that makes use of a magnetic-field-shielding structure in accordance with some embodiments.

FIGS. 5A-5C and 6A-6C depict cross-sectional views of some embodiments of FIGS. 3A-3C and 4A-4C, respectively, including a memory device that makes use of a magnetic-field-shielding structure in accordance with some embodiments.

FIGS. 7A-7C and 8A-8C depict cross-sectional views of some embodiments of FIGS. 3A-3C and 4A-4C, respectively, including a memory device that makes use of a magnetic-field-shielding structure in accordance with some embodiments.

FIGS. 9A-9C and 10A-10C depict cross-sectional views of some embodiments of FIGS. 3A-3C and 4A-4C, respectively, including a memory device that makes use of a magnetic-field-shielding structure in accordance with some embodiments.

FIGS. 13A-13C and 14A-14C depict cross-sectional views of some embodiments of FIGS. 3A-3C and 4A-4C, respectively, including a memory device that makes use of a magnetic-field-shielding structure in accordance with some embodiments.

FIGS. 15A-15C and 16A-16C depict cross-sectional views of some embodiments of FIGS. 3A-3C and 4A-4C, respectively, including a memory device that makes use of a magnetic-field-shielding structure in accordance with some embodiments.

FIGS. 25A-25C and 26A-26C depict cross-sectional views of some embodiments of FIGS. 3A-3C and 4A-4C, respectively, including a memory device that makes use of a magnetic field shielding structure in accordance with some embodiments.

FIGS. 33, 34, 35A-35C, and 36A-36C illustrate cross-sectional views of various embodiments of a method for forming a magnetic field shielding structure around a chip.

DETAILED DESCRIPTION

Figure 1A:
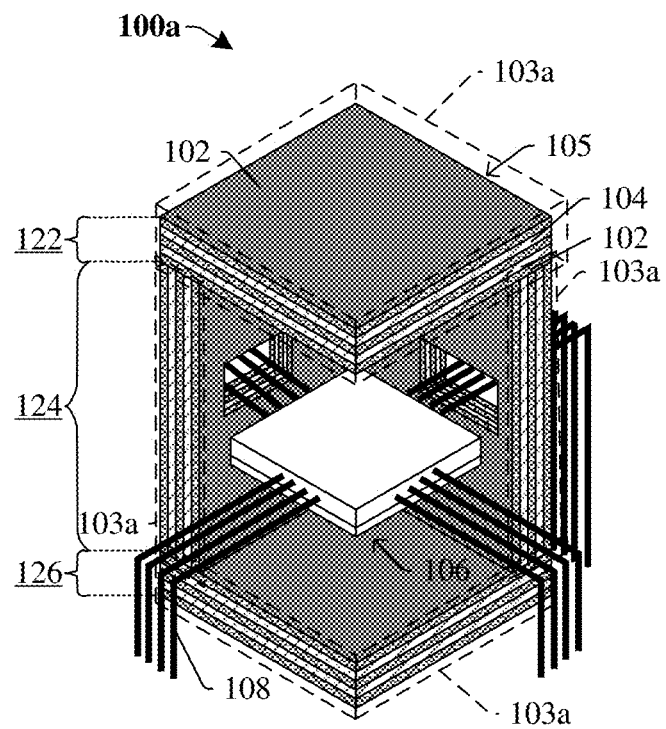
FIGS. 1A, 1B, 1C illustrate perspective views of some embodiments of a memory device that comprises a chip and makes use of a magnetic field shielding structure in accordance with some embodiments, with the front portions removed to more clearly depict inner portions of the memory device.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) includes first and second ferromagnetic films separated by a tunnel barrier layer. One of the ferromagnetic films (often referred to as a "reference layer") has a fixed magnetization direction, while the other ferromagnetic film (often referred to as a "free layer") has a variable magnetization direction. For MTJs with positive tunnelling magnetoresistance (TMR), if the magnetization directions of the reference layer and free layer are in a parallel orientation, it is more likely that electrons will tunnel through the tunnel barrier layer, such that the MTJ is in a low-resistance state. Conversely, if the magnetization directions of the reference layer and free layer are in an anti-parallel orientation, it is less likely that electrons will tunnel through the tunnel barrier layer, such that the MTJ is in a high-resistance state. Consequently, the MTJ can be switched between two states of electrical resistance, a first state with a low resistance ($R_P$: magnetization directions of reference layer and free layer are parallel) and a second state with a high resistance ($R_{AP}$: magnetization directions of reference layer and free layer are anti-parallel). It is noted that MTJs can also have a negative TMR, e.g., lower resistance for anti-parallel orientation and higher resistance for parallel orientation.

Because of their binary nature, MTJs are used in memory cells to store digital data, with the low resistance state $R_P$ corresponding to a first data state (e.g., logical "0"), and the high-resistance state $R_{AP}$ corresponding to a second data state (e.g., logical "1"). Thus, some chips include arrays of MRAM cells where each MRAM cell makes use of an MTJ to store a data state. However, when such a chip comes under the presence of an external magnetic field, the external magnetic field can undesirably "flip" the data states stored in the MRAM cells, leading to data retention problems. To mitigate the adverse effects of external magnetic fields, the present disclosure contemplates at least partially surrounding an MRAM chip with a magnetic-field-shielding structure. The magnetic-field-shielding structure at least partially surrounds the chip and defines a magnetically-shielded zone surrounding the chip. The magnetically-shielded zone has a first magnetic field magnitude that is less than a second magnetic field magnitude immediately outside of an outermost surface of the magnetic-field-shielding structure. Thus, the magnetic-field-shielding structure reduces the magnetic field experienced by the chip, thereby improving data retention within the MRAM cells of the chip.

FIG. 1A illustrates a perspective view of a memory device 100a in accordance with some embodiments with the front portions removed to more clearly depict inner portions of the memory device. The memory device 100a includes a chip 106 and a magnetic field shielding structure 105. Often, the chip 106 includes transistors disposed in a semiconductor substrate, and an array of MRAM cells arranged in an interconnect structure over the semiconductor substrate. An innermost surface of the magnetic field shielding structure 105 at least partially surrounds the chip 106 and establishes a magnetically-shielded-zone proximate to the chip 106. Because of the magnetic field shielding structure 105, the magnetically-shielded zone has a first magnetic field magnitude that is less than a second magnetic field magnitude immediately outside of an outermost surface of the magnetic field shielding structure 105. Thus, the magnetic field shielding structure 105 reduces the magnetic field experienced by the chip 106, thereby helping to improve data retention within MRAM cells on the chip 106. In some embodiments, the first magnetic field magnitude is at least 80 percent less than the second magnetic field magnitude immediately outside the outermost surface of the magnetic field shielding structure 105. In yet another embodiment, the first magnetic field magnitude is 316 oersted (Oe) and the second magnetic field magnitude is 2015 Oe immediately outside the outermost surface of the magnetic field shielding structure 105. The magnetic field shielding structure protects the chip 106 from both direct current (DC) and alternating current (AC) magnetic fields.

Above an upper surface of the chip 106, a top region 122 of the magnetic field shielding structure 105 comprises a first instantiation of a first multilayer stack 103a. Below a lower surface of the chip 106, a bottom region 126 of the magnetic field shielding structure 105 comprises a second instantiation of the first multilayer stack 103a such that individual layers of the second instantiation are arranged in parallel with individual layers of the first instantiation. A sidewall region 124 defined between the top region 122 of the magnetic field shielding structure 105 and the bottom region 126 of the magnetic field shielding structure 105 comprises a third instantiation of the first multilayer stack 103a. The individual layers of the third instantiation of the first multilayer stack 103 are rotated 90 degrees relative to the individual layers of the first and second instantiations. The sidewall region 124 is laterally separated from sidewalls of the chip 106.

For each instantiation, the first multilayer stack 103a comprises one or more magnetic layers 102 and one or more dielectric layers 104. A bottom most layer of the first multilayer stack 103a comprises the magnetic layer 102 and a top most layer of the first multilayer stack 103a comprises the magnetic layer 102. In some embodiments, the magnetic layer 102 and the dielectric layer 104 are individually coated with an insulating adhesive material. In some embodiments, an insulating adhesive layer is placed between each magnetic layer 102 and dielectric layer 104 in the first multilayer stack 103a. The insulating adhesive layer defines a top surface and a bottom surface of the first multilayer stack 103a. Thus, in some embodiments, the first instantiation, the second instantiation, and the third instantiation each have the same number of magnetic layers and dielectric layers as one another, with those respective layers being arranged in the same order, having the same respective compositions, and having the same respective thicknesses for the first, second, and third instantiations. For example, in some embodiments, the first multilayer stack can include 3 magnetic layers and 2 dielectric layers that alternate with one another. In yet another embodiments, the first multilayer stack can include approximately 3 to 100 magnetic layers and approximately 2 to 99 dielectric layers that alternate with one another.

In some embodiments, the first multilayer stack 103a comprises one or more insulating adhesive layers respectively overlaying the one or more magnetic layers 102 and the one or more dielectric layers 104 that respectively overlay the one or more magnetic layers 102. The magnetic layer 102 is a sheet of continuous magnetic material having a length and width which are greater than a length and a width, respectively, of the upper surface of the chip 106. The dielectric layer 104 is a sheet of continuous dielectric material arranged over the magnetic layer 102. The dielectric layer 104 has a length and width which are greater than the length and width, respectively, of the upper surface of the chip 106.

Electric connectors 108 extend through openings in the magnetic field shielding structure 105 and couple to the chip 106, specifically through the third instantiation of the first multilayer stack 103a located in the sidewall region 124. The electric connectors 108 extend through an opening on a face of the magnetic field shielding structure 105. The magnetic field shielding structure 105 is not electrically coupled to the electric connectors 108.

During operation of the chip 106, read and write operations are carried out on the array of MRAM cells. The presence of the magnetic field shielding structure 105 ensures that power used during write operations on the array of MRAM cells is not lost due to external influence. Instead, the magnetic field shielding structure 105 ensures power used during a write operation is contained within the chip 106. Additionally, any magnetic fields independent of the chip 106 will be redirected away from an area immediately outside an outer surface of the chip 106, thereby preventing any undesired change in a set or stored data state and increasing data retention of the array of MRAM cells in the chip 106.

Figure 1B:
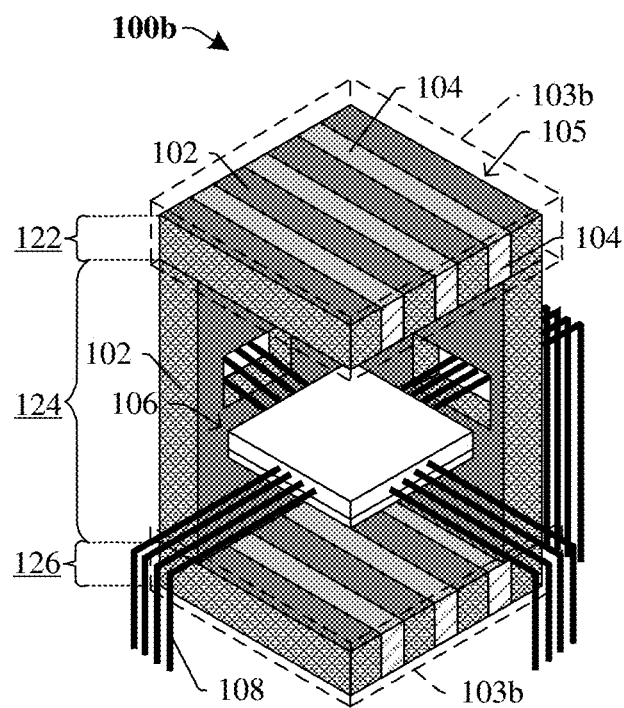

Referring to FIG. 1B, a perspective view 100b of some alternative embodiments of the memory device of FIG. 1A is provided in which the top region 122 of the magnetic shielding structure 105 comprises a first instantiation of a second multilayer stack 103b. The bottom region 126 of the magnetic field shielding structure 105 comprises a second instantiation of the second multilayer stack 103b. The sidewall region 124 defined between the top region 122 of the magnetic field shielding structure 105 and the bottom region 126 of the magnetic field shielding structure 105 comprises the magnetic layer 102. In some embodiments, the magnetic layer 102 within the sidewall region 124 is at least partially surrounded by an insulating adhesive layer and/or at least partially coated in the insulating adhesive material, but in the illustrated embodiment the magnetic layer 102 is a single continuous layer that has a thickness that is greater than or equal to a thickness of the magnetic layer 102 in the second multilayer stack 103b. Electric connectors 108 extend through openings in the magnetic field shielding structure 105 and couple to the chip 106, specifically through the magnetic layer 102 within the sidewall region 124.

In each instantiation, the second multilayer stack 103b comprises a plurality of strips of the magnetic layer 102 and a plurality of strips of the dielectric layer 104 separating the plurality of strips of the magnetic layer 102. Each strip in the plurality of strips of the magnetic layer 102 has a length greater than the length of the upper surface of the chip 106 and a width that is less than the width of the upper surface of the chip 106. Each strip in the plurality of strips of the dielectric layer 104 has a length greater than the length of the upper surface of the chip 106 and a width that is less than the width of the upper surface of the chip 106. In some embodiments, an insulating adhesive strip is placed between each strip in the plurality of strips of the magnetic layer 102 and the dielectric layer 104 in the second multilayer stack 103b, and insulating adhesive layers are respectively placed at a top and bottom surface of the multilayer stack 103b. In some embodiments, the second multilayer stack 103b comprises at least three strips of the magnetic layer 102 and at least three strips of the dielectric layer 104. The top surface of the multilayer stack 103b has a length and width that is greater than the length and width, respectively, of the upper surface of the chip 106.

Figure 1C:
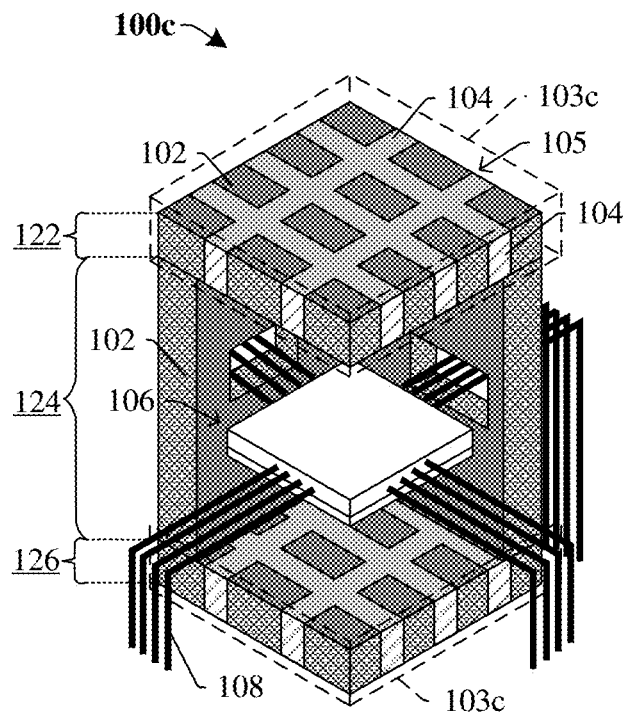

Referring to FIG. 1C, a perspective view 100c of some alternative embodiments of the memory device of FIG. 1A is provided in which the top region 122 of the magnetic shielding structure 105 comprises a first instantiation of a third multilayer stack 103c. The bottom region 126 of the magnetic field shielding structure 105 comprises a second instantiation of the third multilayer stack 103c. The sidewall region 124 defined between the top region 122 of the magnetic field shielding structure 105 and the bottom region 126 of the magnetic field shielding structure 105 comprises the magnetic layer 102. In some embodiments, the magnetic layer 102 within the sidewall region 124 is at least partially surrounded by an insulating adhesive layer and/or at least partially coated in the insulating adhesive material, but in the illustrated embodiment the magnetic layer 102 is a single continuous layer that has a thickness that is greater than or equal to a thickness of the magnetic layer 102 in the third multilayer stack 103c. Electric connectors 108 extend through openings in the magnetic field shielding structure 105 and couple to the chip 106, specifically through the magnetic layer 102 within the sidewall region 124.

The third multilayer stack 103c comprises a plurality of rectangles of the magnetic layer 102 and a grid of the dielectric layer 104 separating the plurality of rectangles of the magnetic layer 102. The plurality of rectangles of the magnetic layer 102 are spaced apart from one another in a series of rows and columns. The grid of the dielectric layer 104 comprises a plurality of linear segments of the dielectric layer 104 which perpendicularly intersect one another. The plurality of rectangles of the magnetic layer 102 are arranged in the grid of the dielectric layer 104 such that neighboring rectangles are separated from one another by at least one linear segment of the grid of the dielectric layer 104. In some embodiments, an insulating adhesive strip is placed between each rectangle in the plurality of rectangles of the magnetic layer 102 and each section of the grid of the dielectric layer 104, and insulating adhesive layers are respectively placed at a top and bottom surface of the third multilayer stack 103c. In some embodiments, the third multilayer stack 103c comprises at least nine rectangles of the magnetic layer 102 and at least six linear segments of the dielectric layer 104. The grid of the dielectric layer 104 has a length and width which are greater than the length and width, respectively, of the upper surface of the chip 106.

The magnetic layer 102 may be or comprise, for example, iron (Fe), cobalt (Co), nickel (Ni), some other magnetic material, some other conductive material, or the like. In some embodiments, the magnetic layer 102 may be formed to a thickness of approximately 10 micrometers to 1,000 micrometers, approximately 10 micrometers to 500 micrometers, approximately 500 micrometers to 1,000 micrometers, or some other suitable value. The dielectric layer 104 may be or comprise, for example, a non-magnetic material, a low ? dielectric, silicon oxide, a high κ dielectric, some other dielectric, or any combination of the foregoing. In some embodiments, the dielectric layer 104 may be formed to a thickness of approximately 10 nanometers to 1,000 micrometers, approximately 10 nanometers to 500 micrometers, approximately 500 micrometers to 1,000 micrometers, or some other suitable value. The electric connectors 108 may be or comprise, for example, copper, aluminum copper, aluminum, tungsten, some other conductive material, or the like. In some embodiments, the magnetic layer 102 comprises a magnetic material and the dielectric layer 104 comprises a non-magnetic material.

Figure 1D:
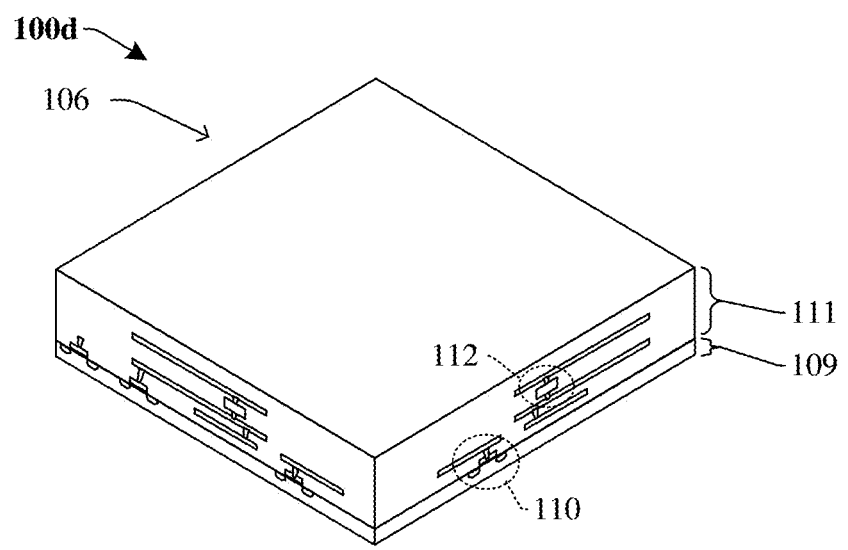
FIG. 1D illustrates a perspective view of the chip of FIGS. 1A, 1B, 1C, with the front portions removed to more clearly depict inner portions of the chip.

Referring to FIG. 1D, a perspective view 100d of some alternative embodiments of the chip 106 of FIG. 1A is provided in which the chip 106 includes a semiconductor substrate 109 and an interconnect structure 111 disposed over the semiconductor substrate 109. Often, the chip includes transistors 110 disposed in the semiconductor substrate 109, and an array of MRAM cells (e.g., MRAM cell 112) arranged in the interconnect structure 111. In some embodiments, the chip 106 has a first face on which active devices, such as transistors 110 and an array of MRAM cells, are disposed, and a second face adjacent the first face, the second face defines an upper surface of the chip 106.

Referring to FIG. 1E, a perspective view 100e of some alternative embodiments of the memory device of FIG. 1A is provided in which the chip 106 and the magnetic field shielding structure 105 are enveloped by an insulating structure 120, such as a molding compound, epoxy, resin, ceramic material, or combinations thereof, defining a package structure 121. The insulating structure 120 at least partially fills a space between an outer surface of the chip 106 and an inner surface of the magnetic field shielding structure 105. The insulating structure 120 at least partially surrounds an outer surface of the magnetic field shielding structure 105. The electric connectors 108 extend through the insulating structure 120 and the magnetic field shielding structure 105 to couple to the chip 106. The electric connectors 108 respectively comprise a conductive contact lead 108a and a conductive wire 108b. In some embodiments, the conductive contact lead 108a extends through the magnetic field shielding structure 105. In yet another embodiment, the conductive contact lead 108a does not extend through the magnetic field shielding structure 105. The conductive wire 108b directly contacts the conductive contact lead 108a and is electrically coupled to the chip 106. The package structure 121 is configured to be mounted on a printed circuit board (PCB) in which each conductive contact lead 108a in the electric connectors 108 electrically couple to the PCB.

Referring to FIG. 2A, a top view 200a of the memory device of FIG. 1A is provided in which the length $L_2$ and the width $W_2$ of the chip 106 are respectively less than the length $L_1$ and the width $W_1$ of an upper surface of the magnetic shielding structure 105. The length $L_2$ of the chip 106 is within a range of approximately 0.5 millimeters to approximately 20 millimeters, and the width $W_2$ of the chip 106 is within a range of approximately 0.5 millimeters to approximately 20 millimeters. The length $L_1$ of the upper surface of the magnetic shielding structure 105 is within a range of approximately 4 millimeters to approximately 10 centimeters, and the width $W_1$ of the upper surface of the magnetic shielding structure 105 is within a range of approximately 4 millimeters to approximately 10 centimeters, or some other suitable value, for example. In some embodiments, the electric connectors 108 vary in size.

Referring to FIG. 2B, a top view 200b of the memory device of FIG. 1B is provided in which a width of a strip in the plurality of strips of the magnetic layer 102 is within a range of approximately 10 micrometers to approximately 1,000 micrometers, or some other suitable value. A width of a strip in the plurality of strips of the dielectric layer 104 is within a range of approximately 10 nanometers to approximately 1,000 micrometers, or some other suitable value.

Referring to FIG. 2C, a top view 200c of the memory device of FIG. 1C is provided in which a width of a rectangle in the plurality of rectangles of the magnetic layer 102 is within a range of approximately 10 micrometers to approximately 1,000 micrometers, or some other suitable value. A width of a linear segment in the plurality of linear segments of the grid of the dielectric layer 104 is within a range of approximately 10 nanometers to 1,000 micrometers, or some other suitable value.

With reference to a range of values used for the length $L_2$ and the width $W_2$ of the chip 106 and the length $L_1$ and the width $W_1$ of an upper surface of the magnetic shielding structure 105 described in relation to FIG. 2A above, it is to be understood that the range of values may be used with embodiments of the memory device in any one of the FIGS. 2B and 2C and their respective perspective view FIGS. 1B and 1C. With reference to FIGS. 2A-2C, a vertical line $P_x$ along the x-axis represents a location in which cross-sectional views in the z-x plane are taken. A horizontal line $P_y$ along the y-axis represents a location in which cross-sectional views in the z-y plane are taken.

Figures 2D, 2E, 2F:
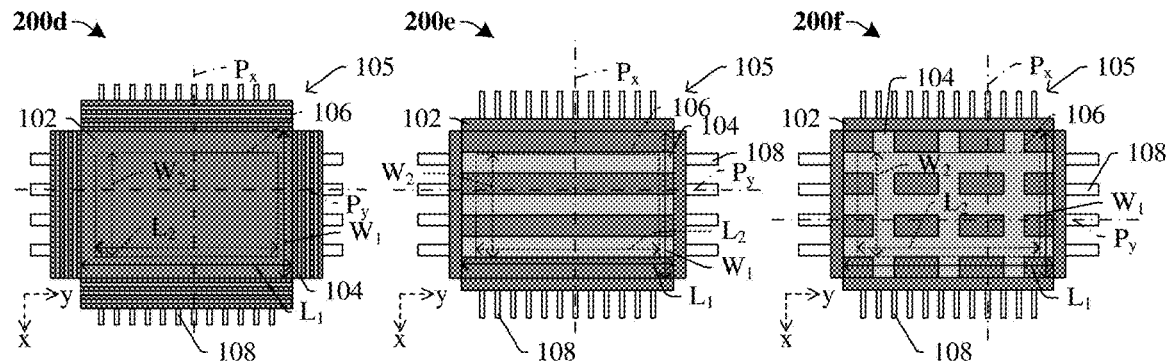
FIGS. 2D-2F depict top views of some embodiments of FIGS. 1A-1C, respectively, including a memory device that makes use of a magnetic-field-shielding structure in accordance with some embodiments.

With reference to FIG. 2D, a top view 200d in the x-y plane of some alternative embodiments of the memory device of FIG. 2A is provided in which an inner surface of the third instantiation of the first multilayer stack 103a is in contact with an outer perimeter of the first instantiation of the first multilayer stack 103a.

With reference to FIG. 2E, a top view 200e in the x-y plane of some alternative embodiments of the memory device of FIG. 2B is provided in which an inner surface of the magnetic layer 102 is in contact with an outer perimeter of the first instantiation of the second multilayer stack 103b.

With reference to FIG. 2F, a top view 200f in the x-y plane of some alternative embodiments of the memory device of FIG. 2C is provided in which an inner surface of the magnetic layer 102 is in contact with an outer perimeter of the first instantiation of the third multilayer stack 103c.

Figures 3A, 3B, 3C:
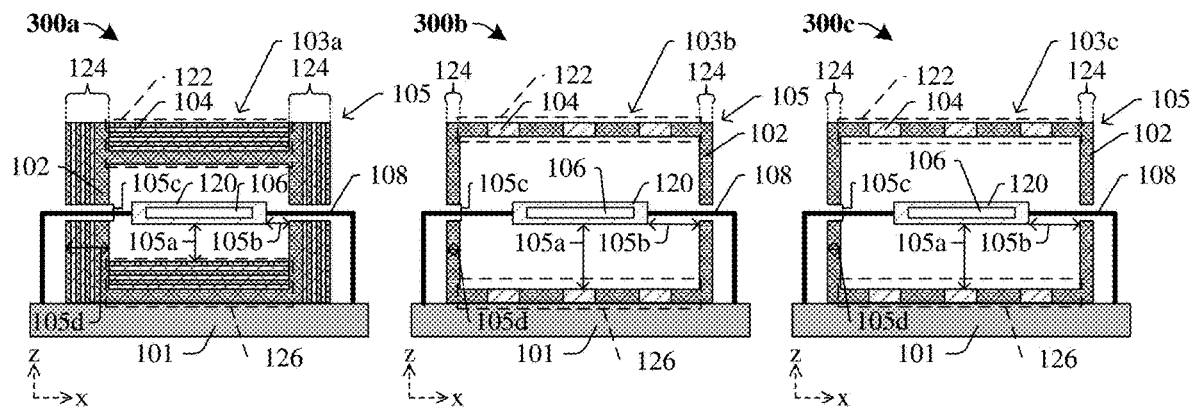
FIGS. 3A-3C depict cross-sectional views of some embodiments of FIGS. 2D-2F, respectively, including a memory device that makes use of a magnetic-field-shielding structure in accordance with some embodiments.

Referring to FIG. 3A, a cross-sectional view 300a in the z-x plane of some additional embodiments of the memory device at the vertical line $P_x$ of FIG. 2D is provided in which the magnetic shielding structure 105 completely surrounds the chip 106. The electric connectors 108 extend from a PCB 101 and extend through the magnetic shielding structure 105 coupling to the chip 106. The insulating structure 120 envelopes the chip 106. An outer surface of the insulating structure 120 is separated from the inner surface of the magnetic shielding structure 105 by a non-zero distance in some embodiments, but in other embodiments the outer surface of the insulating structure 120 can be in direct contact with the inner surface of the magnetic shielding structure 105. The first instantiation of the first multilayer stack 103a is disposed within the top region 122 above the upper surface of the chip 106. The second instantiation of the first multilayer stack 103a is disposed within the bottom region 126 below the lower surface of the chip 106. The third instantiation of the first multilayer stack 103a is disposed within the sidewall region 124 laterally offset from sidewalls of the chip 106.

A vertical distance 105a between a bottom surface of the insulating structure 120 and a top surface of the multilayer stack 103a in the bottom region 126 is within a range of approximately 0 mm to 1.25 mm. The vertical distance 105a is also defined between a top surface of the insulating structure 120 and a bottom surface of the multilayer stack 103a in the top region 122. A horizontal distance 105b between a sidewall of the insulating structure 120 and a sidewall of the multilayer stack 103a in the sidewall region 124 is within a range of approximately 0 mm to 1.25 mm. A width 105d of the sidewall region 124 is within a range of approximately 0.05 μm to 1.25 cm. An opening distance 105c is within a range of approximately 0.05 mm and 2.25 mm. In some embodiments, the insulating structure 120 does not exist and therefore distances such as vertical distance 105a, and horizontal distance 105b are relative to the chip 106.

Referring to FIG. 3B, a cross-sectional view 300b in the z-x plane of some additional embodiments of the memory device at the vertical line $P_x$ of FIG. 2E is provided in which the magnetic shielding structure 105 envelopes the chip 106. The electric connectors 108 extend from a PCB 101 and extend through the magnetic shielding structure 105 coupling to the chip 106. The insulating structure 120 envelopes the chip 106. An outer surface of the insulating structure 120 is laterally and vertically separated from the inner surface of the magnetic shielding structure 105 by a non-zero distance in some embodiments, but in other embodiments the outer surface of the insulating structure 120 can be in direct contact with the inner surface of the magnetic shielding structure 105. The first instantiation of the second multilayer stack 103b is disposed within the top region 122 above the upper surface of the chip 106. The second instantiation of the second multilayer stack 103b is disposed within the bottom region 126 below the lower surface of the chip 106. The magnetic layer 102 is disposed within the sidewall region 124 laterally offset from sidewalls of the chip 106.

Referring to FIG. 3C, a cross-sectional view 300c in the z-x plane of some additional embodiments of the memory device at the vertical line $P_x$ of FIG. 2F is provided in which the magnetic shielding structure 105 envelopes the chip 106. The electric connectors 108 extend from a PCB 101 and extend through the magnetic shielding structure 105 coupling to the chip 106. The insulating structure 120 envelopes the chip 106. An outer surface of the insulating structure 120 is laterally and vertically separated from the inner surface of the magnetic shielding structure 105 by a non-zero distance in some embodiments, but in other embodiments the outer surface of the insulating structure 120 can be in direct contact with the inner surface of the magnetic shielding structure 105. The first instantiation of the third multilayer stack 103c is disposed within the top region 122 above the upper surface of the chip 106. The second instantiation of the third multilayer stack 103c is disposed within the bottom region 126 below the lower surface of the chip 106. The magnetic layer 102 is disposed within the sidewall region 124 laterally offset from sidewalls of the chip 106.

Figures 4A, 4B, 4C:
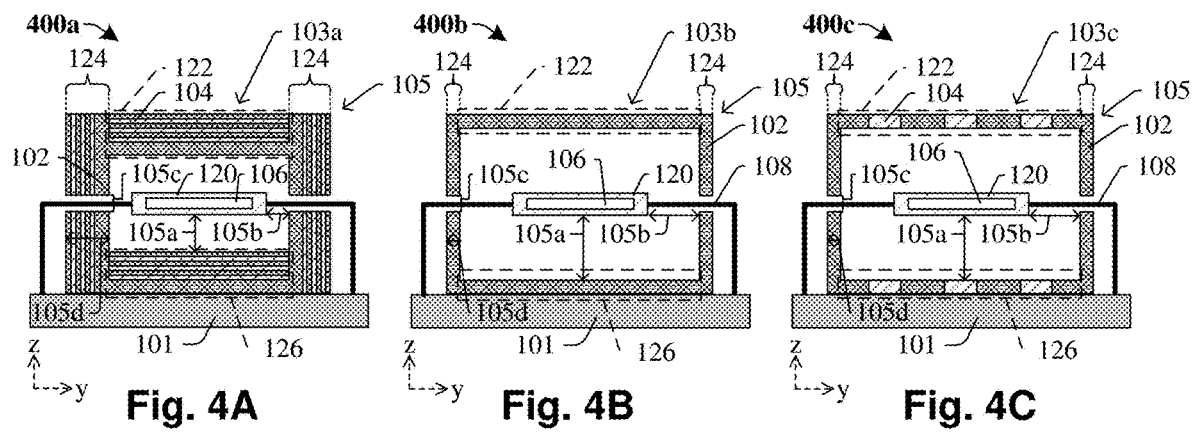
FIGS. 4A-4C depict cross-sectional views of some embodiments of FIGS. 2D-2F, respectively, including a memory device that makes use of a magnetic-field-shielding structure in accordance with some embodiments.

Referring to FIG. 4A, a cross-sectional view 400a in the z-y plane of some additional embodiments of the memory device at the horizontal line $P_y$ of FIG. 2D is provided in which the magnetic shielding structure 105 completely surrounds the chip 106. The electric connectors 108 extend from a PCB 101 and extend through the magnetic shielding structure 105 coupling to the chip 106. The insulating structure 120 envelopes the chip 106. An outer surface of the insulating structure 120 is separated from the inner surface of the magnetic shielding structure 105 by a non-zero distance in some embodiments, but in other embodiments the outer surface of the insulating structure 120 can be in direct contact with the inner surface of the magnetic shielding structure 105. The first instantiation of the first multilayer stack 103a is disposed within the top region 122 above the upper surface of the chip 106. The second instantiation of the first multilayer stack 103a is disposed within the bottom region 126 below the lower surface of the chip 106. The third instantiation of the first multilayer stack 103a is disposed within the sidewall region 124 laterally offset from sidewalls of the chip 106.

Referring to FIG. 4B, a cross-sectional view 400b in the z-y plane of some additional embodiments of the memory device at the horizontal line $P_y$ of FIG. 2E is provided in which the magnetic shielding structure 105 envelopes the chip 106. The electric connectors 108 extend from a PCB 101 and extend through the magnetic shielding structure 105 coupling to the chip 106. The insulating structure 120 envelopes the chip 106. An outer surface of the insulating structure 120 is laterally and vertically separated from the inner surface of the magnetic shielding structure 105 by a non-zero distance in some embodiments, but in other embodiments the outer surface of the insulating structure 120 can be in direct contact with the inner surface of the magnetic shielding structure 105. The first instantiation of the second multilayer stack 103b is disposed within the top region 122 above the upper surface of the chip 106. The second instantiation of the second multilayer stack 103b is disposed within the bottom region 126 below the lower surface of the chip 106. The magnetic layer 102 is disposed within the sidewall region 124 laterally offset from sidewalls of the chip 106.

Referring to FIG. 4C, a cross-sectional view 400c in the z-y plane of some additional embodiments of the memory device at the horizontal line $P_y$ of FIG. 2F is provided in which the magnetic shielding structure 105 envelopes the chip 106. The electric connectors 108 extend from a PCB 101 and extend through the magnetic shielding structure 105 coupling to the chip 106. The insulating structure 120 envelopes the chip 106. An outer surface of the insulating structure 120 is laterally and vertically separated from the inner surface of the magnetic shielding structure 105 by a non-zero distance in some embodiments, but in other embodiments the outer surface of the insulating structure 120 can be in direct contact with the inner surface of the magnetic shielding structure 105. The first instantiation of the third multilayer stack 103c is disposed within the top region 122 above the upper surface of the chip 106. The second instantiation of the third multilayer stack 103c is disposed within the bottom region 126 below the lower surface of the chip 106. The magnetic layer 102 is disposed within the sidewall region 124 laterally offset from sidewalls of the chip 106.

With reference to a range of values used for the vertical distance 105a, horizontal distance 105b, opening distance 105c, and width 105d described in relation to FIG. 3A above, it is to be understood that the range of values may be used with embodiments of the memory device in any one of the respectively labeled distances and/or widths of FIGS. 3B, 3C, 4A, 4B, and 4C.

With reference to FIGS. 5A and 6A, cross-sectional views 500a and 600a in the z-x plane and z-y plane of some alternative embodiments of the memory device of FIGS. 3A and 4A is provided respectively in which lower inner sidewalls of the magnetic shielding structure 105 are spaced apart from one another by an air gap within the magnetic shielding structure 105. In some embodiments, for example, the air gap exists in the bottom region 126 in place of the magnetic layer 102 and dielectric layer 104. Furthermore, in some embodiments, the second instantiation of the first multilayer stack 103a is not within the bottom region 126.

With reference to FIGS. 5B and 6B, cross-sectional views 500b and 600b in the z-x plane and z-y plane of some alternative embodiments of the memory device of FIGS. 3B and 4B is provided respectively in which lower inner sidewalls of the magnetic shielding structure 105 are spaced apart from one another by an air gap within the magnetic shielding structure 105. In some embodiments, for example, the air gap exists in the bottom region 126 in place of the magnetic layer 102 and dielectric layer 104. Furthermore, in some embodiments, the second instantiation of the second multilayer stack 103b is not within the bottom region 126.

With reference to FIGS. 5C and 6C, cross-sectional views 500c and 600c in the z-x plane and z-y plane of some alternative embodiments of the memory device of FIGS. 3C and 4C is provided respectively in which lower inner sidewalls of the magnetic shielding structure 105 are spaced apart from one another by an air gap within the magnetic shielding structure 105. In some embodiments, for example, the air gap exists in the bottom region 126 in place of the magnetic layer 102 and dielectric layer 104. Furthermore, in some embodiments, the second instantiation of the third multilayer stack 103c is not within the bottom region 126.

With reference to FIGS. 5A-5C and 6A-6C in some embodiments, a support structure 502 is within the bottom region 126 supplying structural support to the magnetic shielding structure 105. The support structure 502 extends continuously between the lower inner sidewalls of the magnetic shielding structure 105 in the bottom region 126. The support structure 502 can comprise, for example, a dielectric sheet, an insulator sheet, or a thin metal layer. In some embodiments, there is no support structure 502.

With reference to FIGS. 7A and 8A, cross-sectional views 700a and 800a in the z-x plane and z-y plane of some alternative embodiments of the memory device of FIGS. 3A and 4A is provided respectively in which upper inner sidewalls of the magnetic shielding structure 105 are spaced apart from one another by an air gap within the magnetic shielding structure 105. In some embodiments, for example, the air gap exists in the top region 122 in place of the magnetic layer 102 and dielectric layer 104. Furthermore, in some embodiments, the first instantiation of the first multilayer stack 103a is not within the top region 122.

With reference to FIGS. 7B and 8B, cross-sectional views 700b and 800b in the z-x plane and z-y plane of some alternative embodiments of the memory device of FIGS. 3B and 4B is provided respectively in which upper inner sidewalls of the magnetic shielding structure 105 are spaced apart from one another by an air gap within the magnetic shielding structure 105. In some embodiments, for example, the air gap exists in the top region 122 in place of the magnetic layer 102 and dielectric layer 104. Furthermore, in some embodiments, the first instantiation of the second multilayer stack 103b is not within the top region 122.

With reference to FIGS. 7C and 8C, cross-sectional views 700c and 800c in the z-x plane and z-y plane of some alternative embodiments of the memory device of FIGS. 3C and 4C is provided respectively in which upper inner sidewalls of the magnetic shielding structure 105 are spaced apart from one another by an air gap within the magnetic shielding structure 105. In some embodiments, for example, the air gap exists in the top region 122 in place of the magnetic layer 102 and dielectric layer 104. Furthermore, in some embodiments, the first instantiation of the third multilayer stack 103c is not within the top region 122.

With reference to FIGS. 7A-7C and 8A-8C in some embodiments, an upper support structure 702 is within the top region 122 supplying structural support to the magnetic shielding structure 105. The upper support structure 702 extends continuously between inner sidewalls of the sidewall region 124 defining a top surface of the magnetic shielding structure 105. The support structure 702 extends continuously between the upper inner sidewalls of the magnetic shielding structure 105 in the top region 122. The upper support structure 702 can comprise, for example, a dielectric sheet, an insulator sheet, or a thin metal layer. In some embodiments, there is no upper support structure 702.

With reference to FIGS. 9A and 10A, cross-sectional views 900a and 1000a in the z-x plane and z-y plane of some alternative embodiments of the memory device of FIGS. 3A and 4A is provided respectively in which an upper inner surface and a lower inner surface of the magnetic shielding structure 105 are spaced apart from one another by an air gap within the magnetic shielding structure 105. In some embodiments, for example, the air gap exists in a top portion 124a of the sidewall region 124 in place of the magnetic layer 102 and dielectric layer 104. Furthermore, in some embodiments, a portion of the third instantiation of the first multilayer stack 103a is not within the top portion 124a of the sidewall region 124.

With reference to FIGS. 9B and 10B, cross-sectional views 900b and 1000b in the z-x plane and z-y plane of some alternative embodiments of the memory device of FIGS. 3B and 4B is provided respectively in which an upper inner surface and a lower inner surface of the magnetic shielding structure 105 are spaced apart from one another by an air gap within the magnetic shielding structure 105. In some embodiments, for example, the air gap exists in a top portion 124a of the sidewall region 124 in place of the magnetic layer 102. Furthermore, in some embodiments, a portion of the magnetic layer 102 is not within the top portion 124a of the sidewall region 124.

With reference to FIGS. 9C and 10C, cross-sectional views 900c and 1000c in the z-x plane and z-y plane of some alternative embodiments of the memory device of FIGS. 3C and 4C is provided respectively in which an upper inner surface and a lower inner surface of the magnetic shielding structure 105 are spaced apart from one another by an air gap within the magnetic shielding structure 105. In some embodiments, for example, the air gap exists in a top portion 124a of the sidewall region 124 in place of the magnetic layer 102. Furthermore, in some embodiments, a portion of the magnetic layer 102 is not within the top portion 124a of the sidewall region 124.

With reference to FIGS. 9A-9C and 10A-10C in some embodiments, a support structure 902 is within the top portion 124a of the sidewall region 124 supplying structural support to the magnetic shielding structure 105. The support structure 902 extends continuously between a bottom portion 124b of the sidewall region 124 to the top region 122. The support structure 902 extends continuously between the upper inner surface and lower inner surface of the magnetic shielding structure 105 in the top portion 124a of the sidewall region 124. The support structure 902 can comprise, for example, a dielectric sheet, an insulator sheet, or a thin metal layer. In some embodiments, there is no support structure 902. In some embodiments, the first instantiation of the first, second, and third multilayer stack 103a, 103b, and 103c respectively extend between outer sidewalls of the sidewall region 124. Where outer sidewalls of the respective first instantiation of the first, second, and third multilayer stack 103a, 103b, and 103c are aligned with outer sidewalls of a bottom surface of the magnetic shielding structure 105. In some embodiments, the first instantiation of the first, second, and third multilayer stack 103a, 103b, and 103c is respectively confined within the top region 122 and does not extend to the sidewall region 124.

Figure 11A:
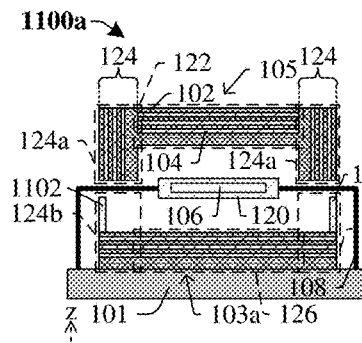
FIGS. 11A-11C and 12A-12C depict cross-sectional views of some embodiments of FIGS. 3A-3C and 4A-4C, respectively, including a memory device that makes use of a magnetic-field-shielding structure in accordance with some embodiments.
Figure 12A:
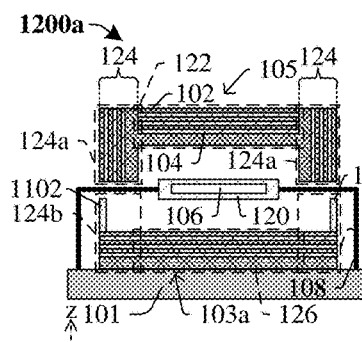

With reference to FIGS. 11A and 12A, cross-sectional views 1100a and 1200a in the z-x plane and z-y plane of some alternative embodiments of the memory device of FIGS. 3A and 4A is provided respectively in which an upper inner surface and a lower inner surface of the magnetic shielding structure 105 are spaced apart from one another by an air gap within the magnetic shielding structure 105. In some embodiments, for example, the air gap exists in a bottom portion 124b of the sidewall region 124 in place of the magnetic layer 102 and dielectric layer 104. Furthermore, in some embodiments, a portion of the third instantiation of the first multilayer stack 103a is not within the bottom portion 124b of the sidewall region 124.

Figure 11B:
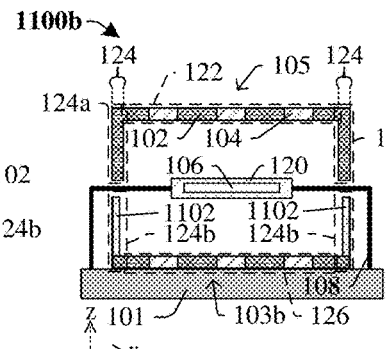
Figure 12B:
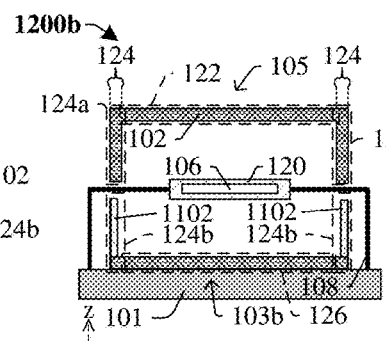

With reference to FIGS. 11B and 12B, cross-sectional views 1100b and 1200b in the z-x plane and z-y plane of some alternative embodiments of the memory device of FIGS. 3B and 4B is provided respectively in which an upper inner surface and a lower inner surface of the magnetic shielding structure 105 are spaced apart from one another by an air gap within the magnetic shielding structure 105. In some embodiments, for example, the air gap exists in a bottom portion 124b of the sidewall region 124 in place of the magnetic layer 102. Furthermore, in some embodiments, a portion of the magnetic layer 102 is not within the bottom portion 124b of the sidewall region 124.

Figure 11C:
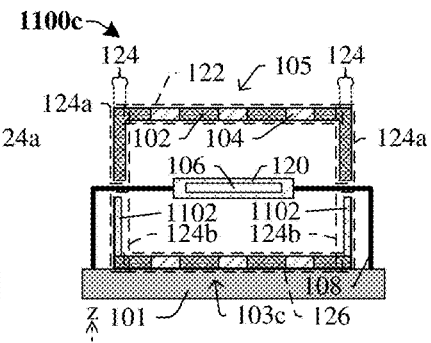
Figure 12C:
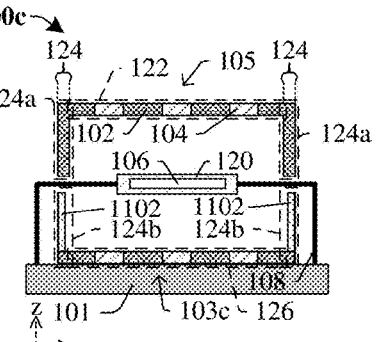

With reference to FIGS. 11C and 12C, cross-sectional views 1100c and 1200c in the z-x plane and z-y plane of some alternative embodiments of the memory device of FIGS. 3C and 4C is provided respectively in which an upper inner surface and a lower inner surface of the magnetic shielding structure 105 are spaced apart from one another by an air gap within the magnetic shielding structure 105. In some embodiments, for example, the air gap exists in a bottom portion 124b of the sidewall region 124 in place of the magnetic layer 102. Furthermore, in some embodiments, a portion of the magnetic layer 102 is not within the bottom portion 124b of the sidewall region 124.

With reference to FIGS. 11A-11C and 12A-12C in some embodiments, a side support structure 1102 is within the bottom portion 124b of the sidewall region 124 supplying structural support to the magnetic shielding structure 105. The side support structure 1102 extends continuously between a top portion 124a of the sidewall region 124 and the bottom region 126. In some embodiments, the side support structure 1102 extends continuously between the upper inner surface and lower inner surface of the magnetic shielding structure 105 in the bottom portion 124b of the sidewall region 124. The side support structure 1102 can comprise, for example, a dielectric sheet, an insulator sheet, or a thin metal layer. In some embodiments, there is no side support structure 1102. In some embodiments, the second instantiation of the first, second, and third multilayer stack 103a, 103b, and 103c respectively extend between outer sidewalls of the sidewall region 124. Where outer sidewalls of the respective second instantiation of the first, second, and third multilayer stack 103a, 103b, and 103c are aligned with outer sidewalls of a top surface of the magnetic shielding structure 105. In some embodiments, the second instantiation of the first, second, and third multilayer stack 103a, 103b, and 103c is respectively confined within the bottom region 126 and does not extend to the sidewall region 124.

Figure 13A:
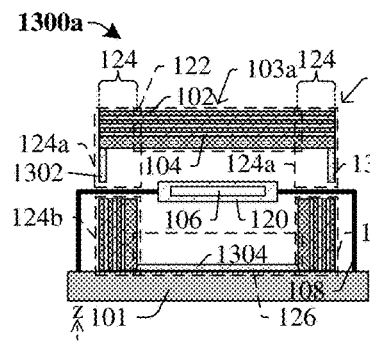

With reference to FIGS. 13A and 14A, cross-sectional views 1300a and 1400a in the z-x plane and z-y plane of some alternative embodiments of the memory device of FIGS. 3A and 4A is provided respectively in which an upper inner surface and a lower inner surface of the magnetic shielding structure 105 are spaced apart from one another by a first air gap within the magnetic shielding structure 105. Inner sidewalls of the magnetic shielding structure 105 are spaced apart from one another by a second air gap within the magnetic shielding structure 105. In some embodiments, for example, the first air gap exists in a top portion 124a of the sidewall region 124 and the second air gap exists in the bottom region 126 in place of the magnetic layer 102 and dielectric layer 104. Furthermore, in some embodiments, a portion of the third instantiation of the first multilayer stack 103a is not within the top portion 124a of the sidewall region 124 and the second instantiation of the first multilayer stack 103a is not within the bottom region 126.

Figure 13B:
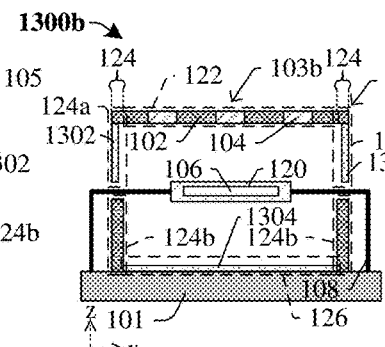

With reference to FIGS. 13B and 14B, cross-sectional views 1300b and 1400b in the z-x plane and z-y plane of some alternative embodiments of the memory device of FIGS. 3B and 4B is provided respectively in which an upper inner surface and a lower inner surface of the magnetic shielding structure 105 are spaced apart from one another by a first air gap within the magnetic shielding structure 105. Inner sidewalls of the magnetic shielding structure 105 are spaced apart from one another by a second air gap within the magnetic shielding structure 105. In some embodiments, for example, the first air gap exists in a top portion 124a of the sidewall region 124 and the second air gap exists in the bottom region 126 in place of the magnetic layer 102. Furthermore, in some embodiments, a portion of the magnetic layer 102 is not within the top portion 124a of the sidewall region 124 and the second instantiation of the second multilayer stack 103b is not within the bottom region 126.

Figure 13C:
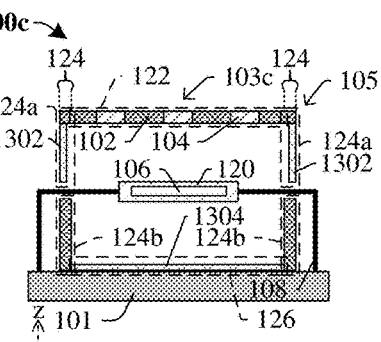

With reference to FIGS. 13C and 14C, cross-sectional views 1300c and 1400c in the z-x plane and z-y plane of some alternative embodiments of the memory device of FIGS. 3C and 4C is provided respectively in which an upper inner surface and a lower inner surface of the magnetic shielding structure 105 are spaced apart from one another by a first air gap within the magnetic shielding structure 105. Inner sidewalls of the magnetic shielding structure 105 are spaced apart from one another by a second air gap within the magnetic shielding structure 105. In some embodiments, for example, the first air gap exists in a top portion 124a of the sidewall region 124 and the second air gap exists in the bottom region 126 in place of the magnetic layer 102. Furthermore, in some embodiments, a portion of the magnetic layer 102 is not within the top portion 124a of the sidewall region 124 and the second instantiation of the third multilayer stack 103c is not within the bottom region 126.

With reference to FIGS. 13A-13C and 14A-14C in some embodiments, a first support structure 1302 is within the top portion 124a of the sidewall region 124 supplying structural support to the magnetic shielding structure 105. The first support structure 1302 extends continuously between a bottom portion 124b of the sidewall region 124 to the top region 122. A second support structure 1304 is within the bottom region 126 supplying structural support to the magnetic shielding structure 105. In some embodiments, the first support structure 1302 extends continuously between the upper inner surface and lower inner surface of the magnetic shielding structure 105 in the top portion 124a of the sidewall region 124. In some embodiments, the second support structure 1304 extends continuously between inner sidewalls of the magnetic shielding structure 105 in the bottom region 126. The second support structure 1304 extends continuously between inner sidewalls of the sidewall region 124. The first support structure 1302 and second support structure 1304 can comprise, for example, a dielectric sheet, an insulator sheet, or a thin metal layer. In some embodiments, there is no first support structure 1302 and/or second support structure 1304. In some embodiments, the first instantiation of the first, second, and third multilayer stack 103a, 103b, and 103c respectively extend between outer sidewalls of the sidewall region 124. Where outer sidewalls of the respective second instantiation of the first, second, and third multilayer stack 103a, 103b, and 103c are aligned with outer sidewalls of a bottom surface of the magnetic shielding structure 105. In some embodiments, the first instantiation of the first, second, and third multilayer stack 103a, 103b, and 103c is respectively confined within the top region 122 and does not extend to the sidewall region 124.

With reference to FIGS. 15A and 16A, cross-sectional views 1500a and 1600a in the z-x plane and z-y plane of some alternative embodiments of the memory device of FIGS. 3A and 4A is provided respectively in which an upper inner surface of the magnetic shielding structure 105 is spaced apart from a top surface of the PCB 101 by an air gap. In some embodiments, for example, the air gap exists in a bottom portion 124b of the sidewall region 124 and the bottom region 126 in place of the magnetic layer 102 and dielectric layer 104. Furthermore, in some embodiments, a portion of the third instantiation of the first multilayer stack 103a is not within the bottom portion 124b of the sidewall region 124 and the second instantiation of the first multilayer stack 103a is not within the bottom region 126.

With reference to FIGS. 15B and 16B, cross-sectional views 1500b and 1600b in the z-x plane and z-y plane of some alternative embodiments of the memory device of FIGS. 3B and 4B is provided respectively in which an upper inner surface of the magnetic shielding structure 105 is spaced apart from a top surface of the PCB 101 by an air gap. In some embodiments, for example, the air gap exists in a bottom portion 124b of the sidewall region 124 and the bottom region 126 in place of the magnetic layer 102 and dielectric layer 104. Furthermore, in some embodiments, a portion of the magnetic layer 102 is not within the bottom portion 124b of the sidewall region 124 and the second instantiation of the second multilayer stack 103b is not within the bottom region 126.

With reference to FIGS. 15C and 16C, cross-sectional views 1500c and 1600c in the z-x plane and z-y plane of some alternative embodiments of the memory device of FIGS. 3C and 4C is provided respectively in which an upper inner surface of the magnetic shielding structure 105 is spaced apart from a top surface of the PCB 101 by an air gap. In some embodiments, for example, the air gap exists in a bottom portion 124b of the sidewall region 124 and the bottom region 126 in place of the magnetic layer 102 and dielectric layer 104. Furthermore, in some embodiments, a portion of the magnetic layer 102 is not within the bottom portion 124b of the sidewall region 124 and the second instantiation of the third multilayer stack 103c is not within the bottom region 126.

With reference to FIGS. 15A-15C and 16A-16C in some embodiments, a support structure 1502 is within the bottom portion 124b of the sidewall region 124 and the bottom region 126 supplying structural support to the magnetic shielding structure 105. The support structure 1502 extends continuously between outer sidewalls of the top portion 124a of the sidewall region 124. In some embodiments, the support structure 1502 extends continuously between a first sidewall 1504 of the magnetic shielding structure 105 and a second sidewall 1506 of the magnetic shielding structure 105 in the bottom portion 124b of the sidewall region 124 and bottom region 126. The support structure 1502 can comprise, for example, a dielectric sheet, an insulator sheet, or a thin metal layer. In some embodiments, there is no support structure 1502.

Figure 17A:
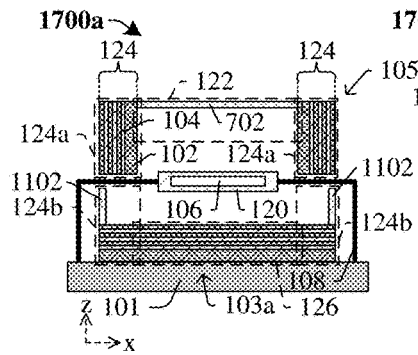
FIGS. 17A-17C and 18A-18C depict cross-sectional views of some embodiments of FIGS. 3A-3C and 4A-4C, respectively, including a memory device that makes use of a magnetic-field-shielding structure in accordance with some embodiments.
Figure 18A:
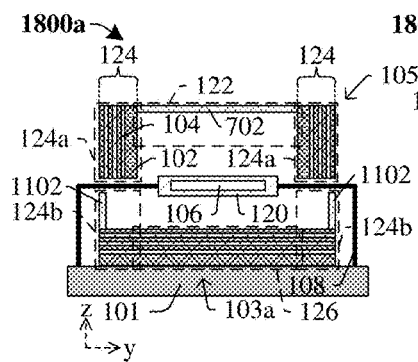

With reference to FIGS. 17A and 18A, cross-sectional views 1700a and 1800a in the z-x plane and z-y plane of some alternative embodiments of the memory device of FIGS. 3A and 4A is provided respectively in which an upper inner surface of the magnetic shielding structure 105 is spaced apart from a bottom inner surface of the magnetic shielding structure 105 by a first air gap. Upper inner sidewalls of the magnetic shielding structure 105 are spaced apart by a second air gap. In some embodiments, for example, the first air gap exists in a bottom portion 124b of the sidewall region 124 and the second air gap exists in a top region 122 in place of the magnetic layer 102 and dielectric layer 104. Furthermore, in some embodiments, a portion of the third instantiation of the first multilayer stack 103a is not within the bottom portion 124b of the sidewall region 124 and the first instantiation of the first multilayer stack 103a is not within the top region 122.

Figure 17B:
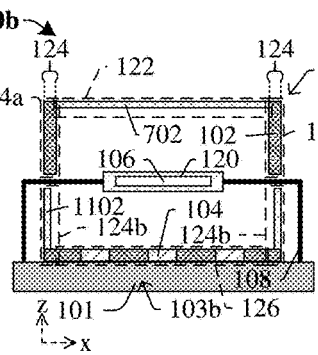
Figure 18B:
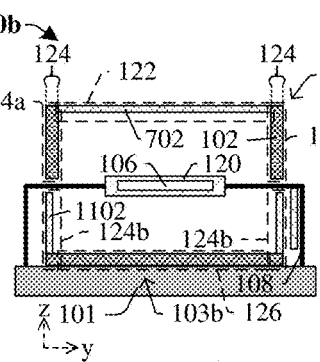

With reference to FIGS. 17B and 18B, cross-sectional views 1700b and 1800b in the z-x plane and z-y plane of some alternative embodiments of the memory device of FIGS. 3B and 4B is provided respectively in which an upper inner surface of the magnetic shielding structure 105 is spaced apart from a bottom inner surface of the magnetic shielding structure 105 by a first air gap. Upper inner sidewalls of the magnetic shielding structure 105 are spaced apart by a second air gap. In some embodiments, for example, the first air gap exists in a bottom portion 124b of the sidewall region 124 and the second air gap exists in a top region 122 in place of the magnetic layer 102. Furthermore, in some embodiments, a portion of the magnetic layer 102 is not within the bottom portion 124b of the sidewall region 124 and the first instantiation of the second multilayer stack 103b is not within the top region 122.

Figure 17C:
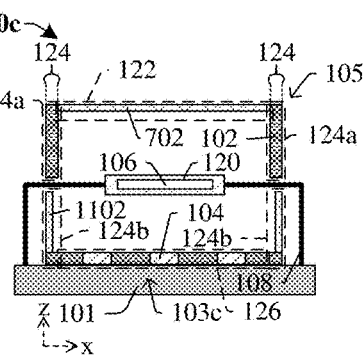
Figure 18C:
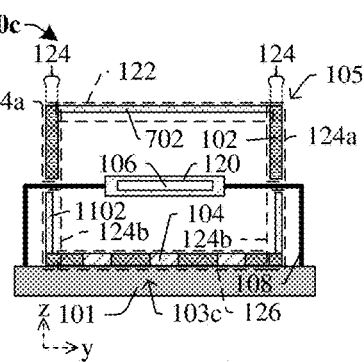

With reference to FIGS. 17C and 18C, cross-sectional views 1700c and 1800c in the z-x plane and z-y plane of some alternative embodiments of the memory device of FIGS. 3C and 4C is provided respectively in which an upper inner surface of the magnetic shielding structure 105 is spaced apart from a bottom inner surface of the magnetic shielding structure 105 by a first air gap. Upper inner sidewalls of the magnetic shielding structure 105 are spaced apart by a second air gap. In some embodiments, for example, the first air gap exists in a bottom portion 124b of the sidewall region 124 and the second air gap exists in a top region 122 in place of the magnetic layer 102. Furthermore, in some embodiments, a portion of the magnetic layer 102 is not within the bottom portion 124b of the sidewall region 124 and the first instantiation of the third multilayer stack 103c is not within the top region 122.

With reference to FIGS. 17A-17C and 18A-18C in some embodiments, the upper support structure 702 is within the top region 122 supplying structural support to the magnetic shielding structure 105. The side support structure 1102 is within the bottom portion 124b of the sidewall region 124 supplying structural support to the magnetic shielding structure 105. In some embodiments, there is no upper support structure 702 and/or side support structure 1102. In some embodiments, the side support structure 1102 extends continuously between the upper inner surface and lower inner surface of the magnetic shielding structure 105 in the bottom portion 124*b* of the sidewall region 124. In some embodiments, the upper support structure 702 extends continuously between inner sidewalls of the magnetic shielding structure 105 in the top region 122. In some embodiments, the second instantiation of the first, second, and third multilayer stack 103*a*, 103*b*, and 103*c* respectively extend between outer sidewalls of the sidewall region 124. Where outer sidewalls of the respective second instantiation of the first, second, and third multilayer stack 103*a*, 103*b*, and 103*c* are aligned with outer sidewalls of a top surface of the magnetic shielding structure 105. In some embodiments, the second instantiation of the first, second, and third multilayer stack 103*a*, 103*b*, and 103*c* is respectively confined within the bottom region 126 and does not extend to the sidewall region 124.

Figure 19A:
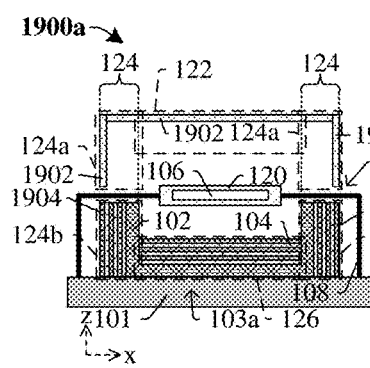
FIGS. 19A-19C and 20A-20C depict cross-sectional views of some embodiments of FIGS. 3A-3C and 4A-4C, respectively, including a memory device that makes use of a magnetic-field-shielding structure in accordance with some embodiments.
Figure 20A:
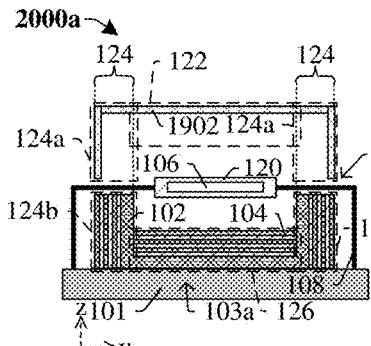

With reference to FIGS. 19A and 20A, cross-sectional views 1900*a* and 2000*a* in the z-x plane and z-y plane of some alternative embodiments of the memory device of FIGS. 3A and 4A is provided respectively in which an upper surface of the chip 106 is covered by an air gap and not covered by the magnetic shielding structure 105. In some embodiments, for example, the air gap exists in a top portion 124*a* of the sidewall region 124 and the top region 122 in place of the magnetic layer 102 and dielectric layer 104. Furthermore, in some embodiments, a portion of the third instantiation of the first multilayer stack 103*a* is not within the top portion 124*a* of the sidewall region 124 and the first instantiation of the first multilayer stack 103*a* is not within the top region 122.

Figure 19B:
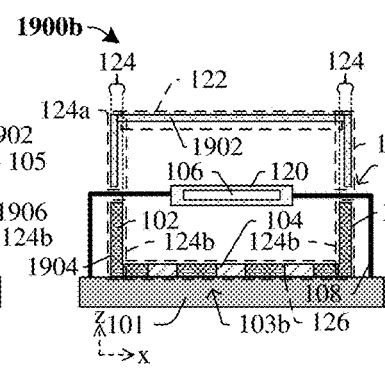
Figure 20B:
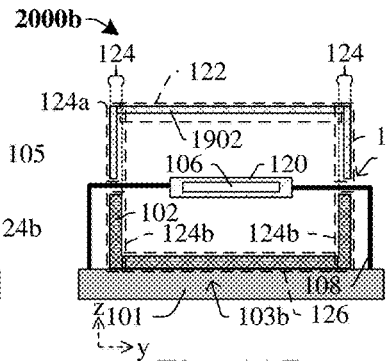

With reference to FIGS. 19B and 20B, cross-sectional views 1900*b* and 2000*b* in the z-x plane and z-y plane of some alternative embodiments of the memory device of FIGS. 3B and 4B is provided respectively in which an upper surface of the chip 106 is covered by an air gap and not covered by the magnetic shielding structure 105. In some embodiments, for example, the air gap exists in a top portion 124*a* of the sidewall region 124 and the top region 122 in place of the magnetic layer 102 and dielectric layer 104. Furthermore, in some embodiments, a portion of the magnetic layer 102 is not within the top portion 124*a* of the sidewall region 124 and the first instantiation of the second multilayer stack 103*b* is not within the top region 122.

Figure 19C:
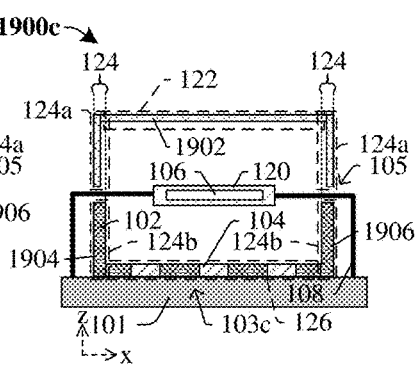
Figure 20C:
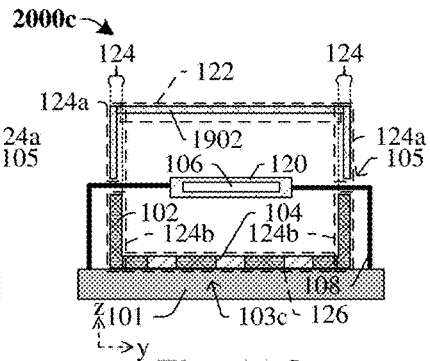

With reference to FIGS. 19C and 20C, cross-sectional views 1900*c* and 2000*c* in the z-x plane and z-y plane of some alternative embodiments of the memory device of FIGS. 3C and 4C is provided respectively in which an upper surface of the chip 106 is covered by an air gap and not covered by the magnetic shielding structure 105. In some embodiments, for example, the air gap exists in a top portion 124*a* of the sidewall region 124 and the top region 122 in place of the magnetic layer 102 and dielectric layer 104. Furthermore, in some embodiments, a portion of the magnetic layer 102 is not within the top portion 124*a* of the sidewall region 124 and the first instantiation of the third multilayer stack 103*c* is not within the top region 122.

With reference to FIGS. 19A-19C and 20A-20C in some embodiments, a top surface support structure 1902 is within the top portion 124*a* of the sidewall region 124 and the top region 122 supplying structural support to the magnetic shielding structure 105. The top surface support structure 1902 extends continuously between outer sidewalls of the bottom portion 124*b* of the sidewall region 124. In some embodiments, the top surface support structure 1902 extends continuously between a first sidewall 1904 of the magnetic shielding structure 105 and a second sidewall 1906 of the magnetic shielding structure 105 in the top portion 124*a* of the sidewall region 124 and top region 122. The top surface support structure 1902 can comprise, for example, a dielectric sheet, an insulator sheet, or a thin metal layer. In some embodiments, there is no top surface support structure 1902. In some embodiments, the second instantiation of the first, second, and third multilayer stack 103*a*, 103*b*, and 103*c* respectively extend between outer sidewalls of the sidewall region 124. Where outer sidewalls of the respective second instantiation of the first, second, and third multilayer stack 103*a*, 103*b*, and 103*c* are aligned with outer sidewalls of the magnetic shielding structure 105. In some embodiments, the second instantiation of the first, second, and third multilayer stack 103*a*, 103*b*, and 103*c* is respectively confined within the bottom region 126 and does not extend to the sidewall region 124.

Figure 21A:
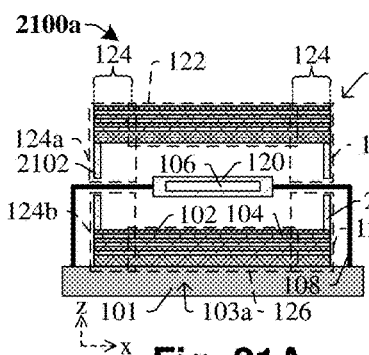
FIGS. 21A-21C and 22A-22C depict cross-sectional views of some embodiments of FIGS. 3A-3C and 4A-4C, respectively, including a memory device that makes use of a magnetic-field-shielding structure in accordance with some embodiments.
Figure 22A:
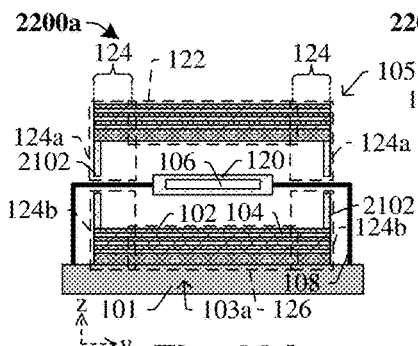

With reference to FIGS. 21A and 22A, cross-sectional views 2100*a* and 2200*a* in the z-x plane and z-y plane of some alternative embodiments of the memory device of FIGS. 3A and 4A is provided respectively in which an upper inner surface of the magnetic shielding structure 105 is separated from a bottom inner surface of the magnetic shielding structure 105 by an air gap. In some embodiments, for example, the air gap exists in the sidewall region 124 in place of the magnetic layer 102 and dielectric layer 104. Furthermore, in some embodiments, the third instantiation of the first multilayer stack 103*a* is not within the sidewall region 124.

Figure 21B:
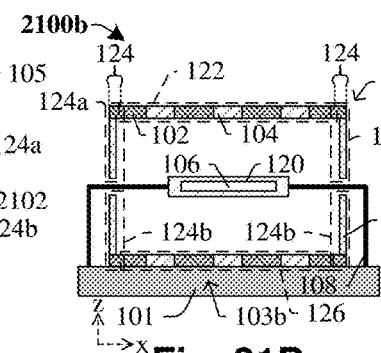
Figure 22B:
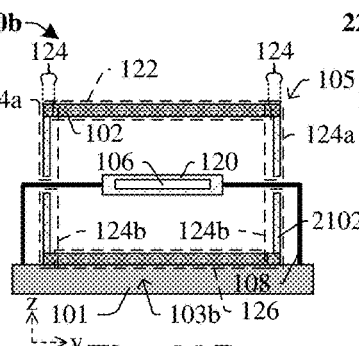

With reference to FIGS. 21B and 22B, cross-sectional views 2100*b* and 2200*b* in the z-x plane and z-y plane of some alternative embodiments of the memory device of FIGS. 3B and 4B is provided respectively in which an upper inner surface of the magnetic shielding structure 105 is separated from a bottom inner surface of the magnetic shielding structure 105 by an air gap. In some embodiments, for example, the air gap exists in the sidewall region 124 in place of the magnetic layer 102. Furthermore, in some embodiments, the magnetic layer 102 is not within the sidewall region 124.

Figure 21C:
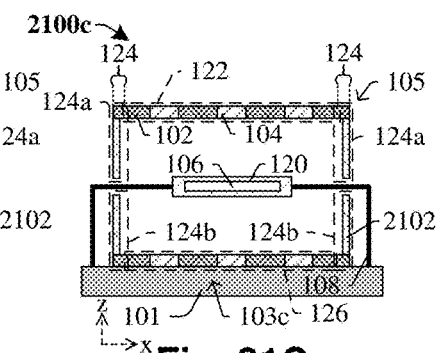
Figure 22C:
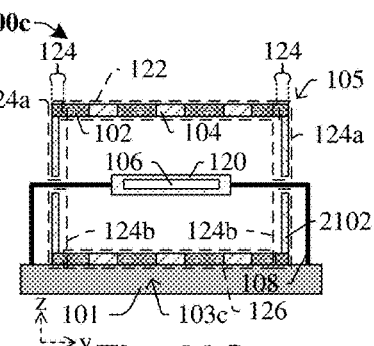

With reference to FIGS. 21C and 22C, cross-sectional views 2100*c* and 2200*c* in the z-x plane and z-y plane of some alternative embodiments of the memory device of FIGS. 3C and 4C is provided respectively in which an upper inner surface of the magnetic shielding structure 105 is separated from a bottom inner surface of the magnetic shielding structure 105 by an air gap. In some embodiments, for example, the air gap exists in the sidewall region 124 in place of the magnetic layer 102. Furthermore, in some embodiments, the magnetic layer 102 is not within the sidewall region 124.

With reference to FIGS. 21A-21C and 22A-22C in some embodiments, a sidewall support structure 2102 is within the sidewall region 124 supplying structural support to the magnetic shielding structure 105. The sidewall support structure 2102 extends continuously between the top region 122 and the bottom region 126. In some embodiments, the sidewall support structure 2102 extends continuously between the bottom inner surface and upper inner surface of the magnetic shielding structure 105 in the sidewall region 124. The sidewall support structure 2102 can comprise, for example, a dielectric sheet, an insulator sheet, or a thin metal layer. In some embodiments, there is no sidewall support structure 2102. In some embodiments, the first and second instantiations of the first, second, and third multilayer stack 103*a*, 103*b*, and 103*c* respectively extend between outer sidewalls of the sidewall region 124. Where outer sidewalls of the respective first and second instantiations of the first, second, and third multilayer stack 103a, 103b, and 103c are aligned with outer sidewalls of the magnetic shielding structure 105. In some embodiments, the first and second instantiations of the first, second, and third multilayer stack 103a, 103b, and 103c are respectively confined within the top region 122 and the bottom region 126 and do not extend to the sidewall region 124.

Figures 23A, 23B, 23C:
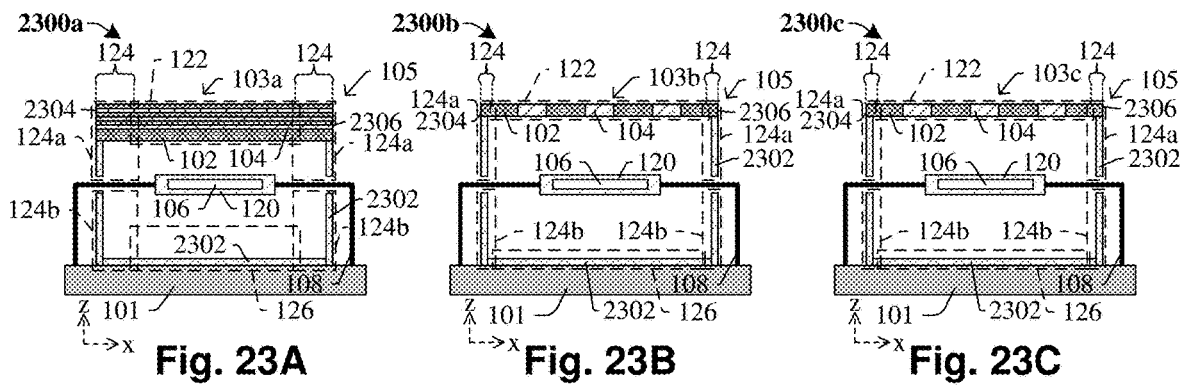
FIGS. 23A-23C and 24A-24C depict cross-sectional views of some embodiments of FIGS. 3A-3C and 4A-4C, respectively, including a memory device that makes use of a magnetic-field-shielding structure in accordance with some embodiments.
Figures 24A, 24B, 24C:
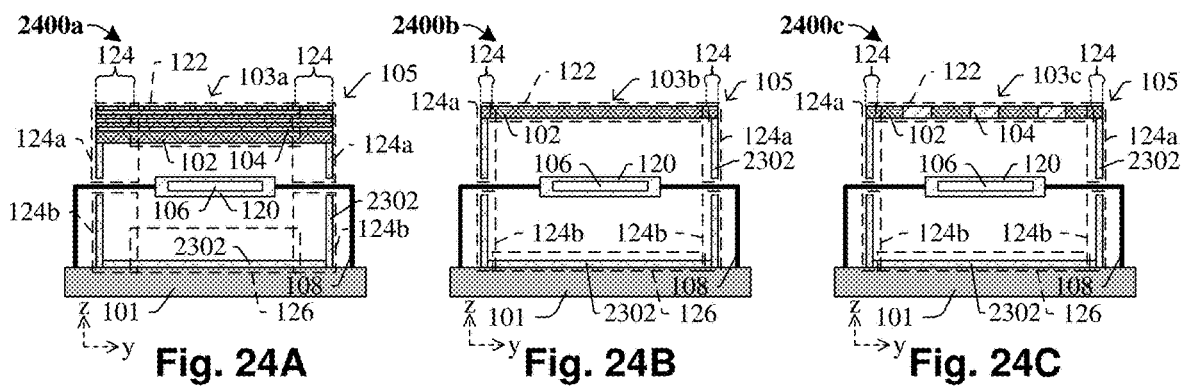

With reference to FIGS. 23A and 24A, cross-sectional views 2300a and 2400a in the z-x plane and z-y plane of some alternative embodiments of the memory device of FIGS. 3A and 4A is provided respectively in which an upper inner surface of the magnetic shielding structure 105 is separated from the PCB 101 by an air gap. In some embodiments, for example, the air gap exists in the sidewall region 124 and bottom region 126 in place of the magnetic layer 102 and dielectric layer 104. Furthermore, in some embodiments, the third instantiation of the first multilayer stack 103a is not within the sidewall region 124 and the second instantiation of the first multilayer stack 103a is not within the bottom region 126.

With reference to FIGS. 23B and 24B, cross-sectional views 2300b and 2400b in the z-x plane and z-y plane of some alternative embodiments of the memory device of FIGS. 3B and 4B is provided respectively in which an upper inner surface of the magnetic shielding structure 105 is separated from the PCB 101 by an air gap. In some embodiments, for example, the air gap exists in the sidewall region 124 and bottom region 126 in place of the magnetic layer 102 and dielectric layer 104. Furthermore, in some embodiments, the magnetic layer 102 is not within the sidewall region 124 and the second instantiation of the second multilayer stack 103b is not within the bottom region 126.

With reference to FIGS. 23C and 24C, cross-sectional views 2300c and 2400c in the z-x plane and z-y plane of some alternative embodiments of the memory device of FIGS. 3C and 4C is provided respectively in which an upper inner surface of the magnetic shielding structure 105 is separated from the PCB 101 by an air gap. In some embodiments, for example, the air gap exists in the sidewall region 124 and bottom region 126 in place of the magnetic layer 102 and dielectric layer 104. Furthermore, in some embodiments, the magnetic layer 102 is not within the sidewall region 124 and the second instantiation of the third multilayer stack 103c is not within the bottom region 126.

With reference to FIGS. 23A-23C and 24A-24C in some embodiments, a lower surface support structure 2302 is within the sidewall region 124 and bottom region 126 supplying structural support to the magnetic shielding structure 105. The lower surface support structure 2302 extends continuously between outer sidewalls of the top region 122. In some embodiments, the lower surface support structure 2302 extends continuously between a first sidewall 2304 of the magnetic shielding structure 105 and a second sidewall 2306 of the magnetic shielding structure 105 in the sidewall region 124 and bottom region 126. The lower surface support structure 2302 can comprise, for example, a dielectric sheet, an insulator sheet, or a thin metal layer. In some embodiments, there is no lower surface support structure 2302. In some embodiments, the first instantiation of the first, second, and third multilayer stack 103a, 103b, and 103c respectively extends between outer sidewalls of the sidewall region 124. Where outer sidewalls of the first instantiation of the first, second, and third multilayer stack 103a, 103b, and 103c are aligned with outer sidewalls of the magnetic shielding structure 105. In some embodiments, the first instantiation of the first, second, and third multilayer stack 103a, 103b, and 103c is respectively confined within the top region 122 and does not extend to the sidewall region 124.

Figures 25A, 25B, 25C:
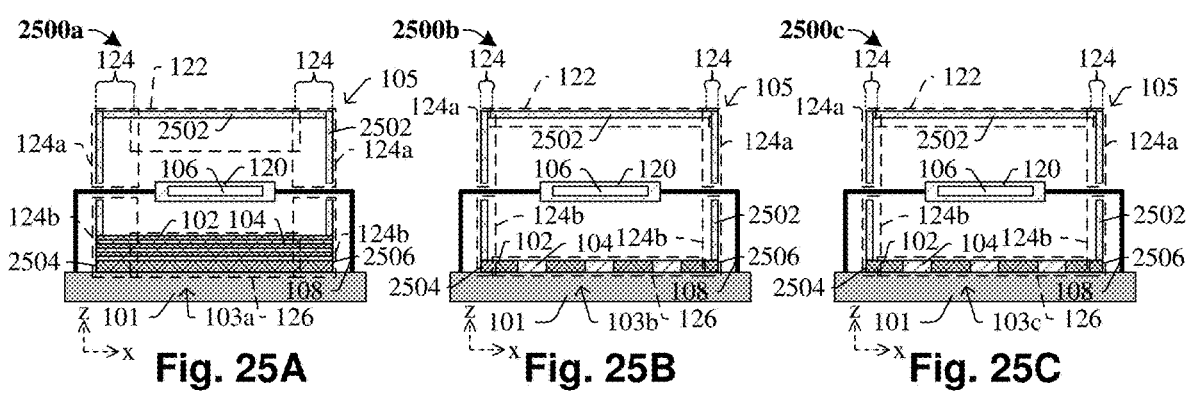

With reference to FIGS. 25A and 26A, cross-sectional views 2500a and 2600a in the z-x plane and z-y plane of some alternative embodiments of the memory device of FIGS. 3A and 4A is provided respectively in which an upper surface of the chip 106 is covered by an air gap and not covered by the magnetic shielding structure 105. In some embodiments, for example, the air gap exists in the sidewall region 124 and the top region 122 in place of the magnetic layer 102 and dielectric layer 104. Furthermore, in some embodiments, the third instantiation of the first multilayer stack 103a is not within the sidewall region 124 and the first instantiation of the first multilayer stack 103a is not within the top region 122.

With reference to FIGS. 25B and 26B, cross-sectional views 2500b and 2600b in the z-x plane and z-y plane of some alternative embodiments of the memory device of FIGS. 3B and 4B is provided respectively in which an upper surface of the chip 106 is covered by an air gap and not covered by the magnetic shielding structure 105. In some embodiments, for example, the air gap exists in the sidewall region 124 and the top region 122 in place of the magnetic layer 102 and dielectric layer 104. Furthermore, in some embodiments, the magnetic layer 102 is not within the sidewall region 124 and the first instantiation of the second multilayer stack 103b is not within the top region 122.

With reference to FIGS. 25C and 26C, cross-sectional views 2500c and 2600c in the z-x plane and z-y plane of some alternative embodiments of the memory device of FIGS. 3C and 4C is provided respectively in which an upper surface of the chip 106 is covered by an air gap and not covered by the magnetic shielding structure 105. In some embodiments, for example, the air gap exists in the sidewall region 124 and the top region 122 in place of the magnetic layer 102 and dielectric layer 104. Furthermore, in some embodiments, the magnetic layer 102 is not within the sidewall region 124 and the first instantiation of the third multilayer stack 103c is not within the top region 122.

With reference to FIGS. 25A-25C and 26A-26C in some embodiments, an upper surface support structure 2502 is within the sidewall region 124 and top region 122 supplying structural support to the magnetic shielding structure 105. The upper surface support structure 2502 extends continuously between outer sidewalls of the bottom region 126. In some embodiments, the upper surface support structure 2502 extends continuously between a first sidewall 2504 of the magnetic shielding structure 105 and a second sidewall 2506 of the magnetic shielding structure 105 in the sidewall region 124 and top region 122. The upper surface support structure 2502 can comprise, for example, a dielectric sheet, an insulator sheet, or a thin metal layer. In some embodiments, there is no upper surface support structure 2502. In some embodiments, the second instantiation of the first, second, and third multilayer stack 103a, 103b, and 103c respectively extends between outer sidewalls of the sidewall region 124. Where outer sidewalls of the second instantiation of the first, second, and third multilayer stack 103a, 103b, and 103c is aligned with outer sidewalls of the magnetic shielding structure 105. In some embodiments, the second instantiation of the first, second, and third multilayer stack 103a, 103b, and 103c is respectively confined within the bottom region 126 and does not extend to the sidewall region 124.

With reference to FIGS. 3A-3C and 4A-4C and any embodiments of FIGS. 3A-3C and 4A-4C, it can be appreciated that any air gap (e.g. an air gap, first air gap, second air gap, etc.) can comprise air and/or materials from the insulating structure 120.

With reference to FIGS. 27, 28A, 28B, 29, 30A, 30B, 31, 32A, and 32B, cross-sectional views 2700, 2800a, 2800b, 2900, 3000a, 3000b, 3100, 3200a, and 3200b of various embodiments of a method for forming sections of a magnetic field shielding structure are provided. The method is illustrated using embodiments of the memory device in FIGS. 3A-3B and 4A-4B. Notwithstanding this, the method may be used to form embodiments of the memory device in any one of FIGS. 5A-5C, 6A-6C, 7A-7C, 8A-8C, 9A-9C, 10A-10C, 11A-11C, 12A-12C, 13A-13C, 14A-14C, 15A-15C, 16A-16C, 17A-17C, 18A-18C, 19A-19C, 20A-20C, 21A-21C, 22A-22C, 23A-23C, 24A-24C, 25A-25C, and 26A-26C. Additionally, as seen hereafter, FIGS. 27, 28A, and 28B correspond to a method for forming the first multilayer stack 103a. FIGS. 27, 28A, 28B, 29, 30A, and 30B correspond to a method for forming the second multilayer stack 103b. FIGS. 27, 28A, 28B, 29, 30A, 30B, 31, 32A, and 32B correspond to a method for forming the third multilayer stack 103c.

Although the cross-sectional views 2700, 2800a, 2800b, 2900, 3000a, 3000b, 3100, 3200a, and 3200b shown in FIGS. 27, 28A, 28B, 29, 30A, 30B, 31, 32A, and 32B are described with reference to a method, it will be appreciated that the structures shown in FIGS. 27, 28A, 28B, 29, 30A, 30B, 31, 32A, and 32B are not limited to the method but rather may stand alone separate of the method. Although FIGS. 27, 28A, 28B, 29, 30A, 30B, 31, 32A, and 32B are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 27:
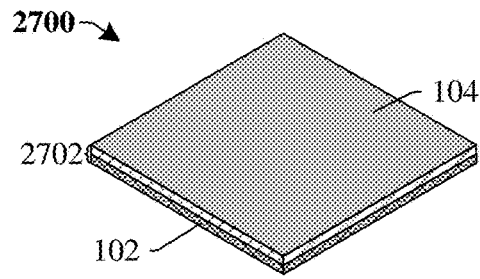
FIGS. 27, 28A, 28B, 29, 30A, 30B, 31, 32A, and 32B illustrate perspective views of various embodiments of a method for forming sections of a magnetic field shielding structure.

As illustrated by the perspective view, with the front portions removed, 2700 of FIG. 27, a magnetic layer 102 (in some embodiments a foil/strip or plate) and a dielectric layer 104 (in some embodiments a foil/strip or plate) are laminated/coated with an adhesive layer (not shown). In some embodiments, the adhesive layer is a foil, strip, or plate that overlies the magnetic layer 102 and the dielectric layer 104, respectively. In yet other embodiments, a substantially thin layer of the adhesive layer completely envelopes the magnetic layer 102 and the dielectric layer 104, respectively. In some embodiments, the adhesive layer is an insulating adhesive layer. A first pair of layers 2702 is defined by a single magnetic layer 102 and a single dielectric layer 104.

Figure 28A:
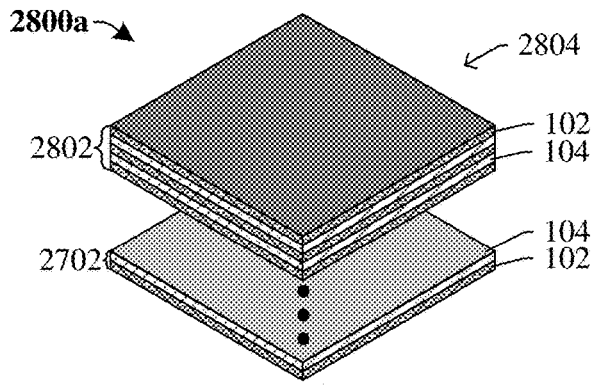

As illustrated by the perspective view, with the front portions removed, 2800a of FIG. 28A, at least one or more pairs of the adhesive laminated magnetic layer 102 and adhesive laminated dielectric layer 104 are formed over the first pair of layers 2702. A last adhesive laminated magnetic layer 102 is formed over the at least one or more pairs of the adhesive laminated magnetic layer 102 and adhesive laminated dielectric layer 104. A stack of layers 2802 is defined by the last adhesive laminated magnetic layer 102 overlaying the at least one or more pairs of the adhesive laminated magnetic layer 102 and adhesive laminated dielectric layer 104.

Figure 28B:
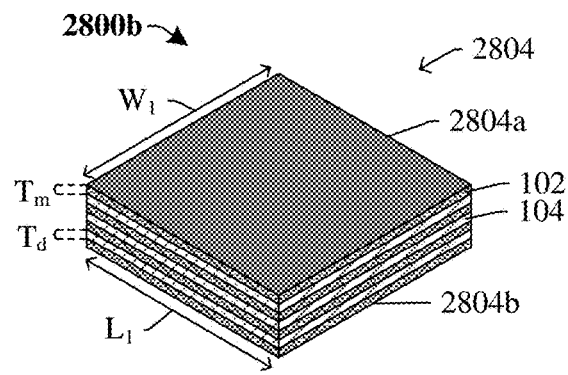

As illustrated by the perspective view, with the front portions removed, 2800b of FIG. 28B, the stack of layers (2802 of FIG. 28A) are attached to the first pair of layers (2702 of FIG. 28A) defining a first multilayer sheet 2804. A top surface 2804a of the first multilayer sheet 2804 is defined by a top surface of the last adhesive laminated magnetic layer 102 (of FIG. 28A). A bottom surface 2804b of the first multilayer sheet 2804 is defined by a bottom surface of the magnetic layer 102 of the first pair of layers (2702 of FIG. 28A). The length $L_1$ of the first multilayer sheet 2804 is within a range of approximately 4 millimeters to approximately 10 centimeters, and the width $W_1$ of the first multilayer sheet 2804 is within a range of approximately 4 millimeters to approximately 10 centimeters, or some other suitable value, for example. In some embodiments, the length and width $L_1$, $W_1$ of the first multilayer sheet 2804 respectively are formed to values suitable for the first multilayer stack 103a. In yet other embodiments, the length and width $L_1$, $W_1$ of the first multilayer sheet 2804 respectively are formed to values substantially greater than the first multilayer stack 103a. In some embodiments, the first multilayer sheet 2804 comprises at least three or more magnetic layers 102 and three or more dielectric layers 104.

A thickness $T_m$ defines the thickness of each magnetic layer 102 in the first multilayer sheet 2804. The thickness $T_m$ is within a range of approximately 10 micrometers to approximately 1,000 micrometers, or some other suitable value. In some embodiments, the thickness $T_m$ is the same for each magnetic layer 102 in the first multilayer sheet 2804. In some embodiments, the thickness $T_m$ is the same for a first plurality of magnetic layers 102 in the first multilayer sheet 2804 and different for a second plurality of magnetic layers 102 in the first multilayer sheet 2804. In yet another embodiment, the magnetic layer 102 of the first pair of layers (2702 of FIG. 28A) is substantially thicker than the thickness of the magnetic layers 102 in the stack of layers (2802 of FIG. 28A). The magnetic layer 102 may be or comprise, for example, iron (Fe), cobalt (Co), nickel (Ni), some other magnetic material, some other conductive material, or the like.

A thickness $T_d$ defines the thickness of each dielectric layer 104 in the first multilayer sheet 2804. The thickness $T_d$ is within a range of approximately 10 nanometers to approximately 1,000 micrometers, or some other suitable value. In some embodiments, the thickness $T_d$ is the same for each dielectric layer 104 in the first multilayer sheet 2804. In some embodiments, the thickness $T_d$ is the same for a first plurality of dielectric layers 104 in the first multilayer sheet 2804 and different for a second plurality of dielectric layers 104 in the first multilayer sheet 2804. In yet another embodiment, the dielectric layer 104 of the first pair of layers (2702 of FIG. 28A) is substantially thicker than the thickness of the dielectric layers 104 in the stack of layers (2802 of FIG. 28A). The dielectric layer 104 may be or comprise, for example, a low κ dielectric, silicon oxide, a high κ dielectric, some other dielectric, or any combination of the foregoing.

Figure 29:
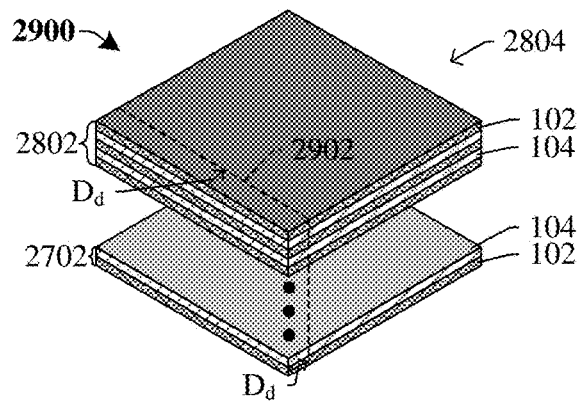

As illustrated by the perspective view, with the front portions removed, 2900 of FIG. 29, a distance $D_d$ is set from an outer edge of the first multilayer sheet 2804 defining a first cut line 2902. The distance $D_d$ is within a range of approximately 1 micrometer to 10,000 micrometers, approximately 1 micrometer to 5,000 micrometers, approximately 5,000 micrometers to 10,000 micrometers, or some other suitable value.

Figure 30A:
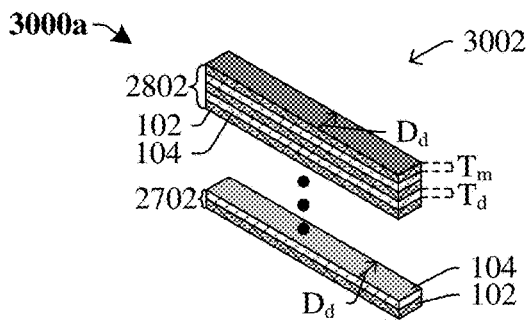

As illustrated by the perspective view, with the front portions removed, 3000a of FIG. 30A, the first multilayer sheet (2804 of FIG. 29) is tailored (or cut) along the first cut line (2902 of FIG. 29) defining a second multilayer sheet 3002. The distance $D_d$ defines a width of the second multilayer sheet 3002.

Figure 30B:
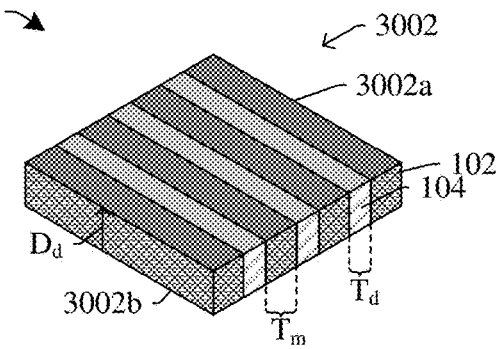

As illustrated by the perspective view, with the front portions removed, 3000b of FIG. 30B, the second multilayer sheet 3002 (of FIG. 30A) is rotated 90 degrees. A top surface 3002a of the second multilayer sheet 3002 comprises a top surface of a plurality of strips of the magnetic layer 102 and dielectric layer 104. A bottom surface 3002b of the second multilayer sheet 3002 comprises a bottom surface of the plurality of strips of the magnetic layer 102 and dielectric layer 104. In some embodiments, the second multilayer sheet 3002 comprises at least three or more magnetic strips 102 and two or more dielectric strips 104. In some embodiments, the second multilayer sheet 3002 defines the second multilayer stack 103b.

Figure 31:
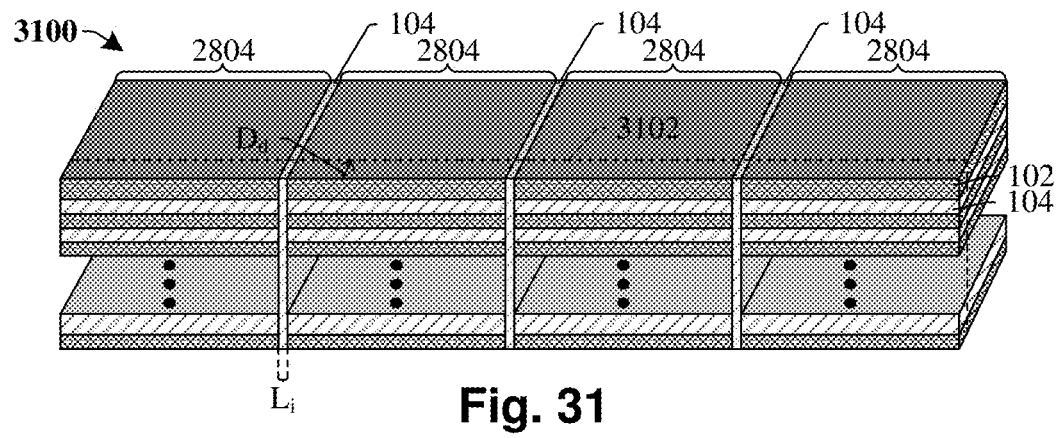

As illustrated by the perspective view, with the front portions removed, 3100 of FIG. 31, a plurality of M (a number greater than 2) first multilayer sheet (2804 of FIG. 29) are disposed between M-1 adhesive laminated dielectric layers 104. The plurality of M first multilayer sheet 2804 are attached (or glued) to the respective M-1 adhesive laminated dielectric layers 104. In some embodiments, M is a number equal to or greater than 4. A distance $D_d$ is set from an outer edge of the plurality of M first multilayer sheet 2804 defining a second cut line 3102. The distance $D_d$ is within a range of approximately 10 micrometers to approximately 10,000 micrometers, or some other suitable value. A thickness $L_t$ of each of the M-1 adhesive laminated dielectric layers 104 are respectively within a range of approximately 10 nanometers to approximately 1,000 micrometers, or some other suitable value.

Figure 32A:
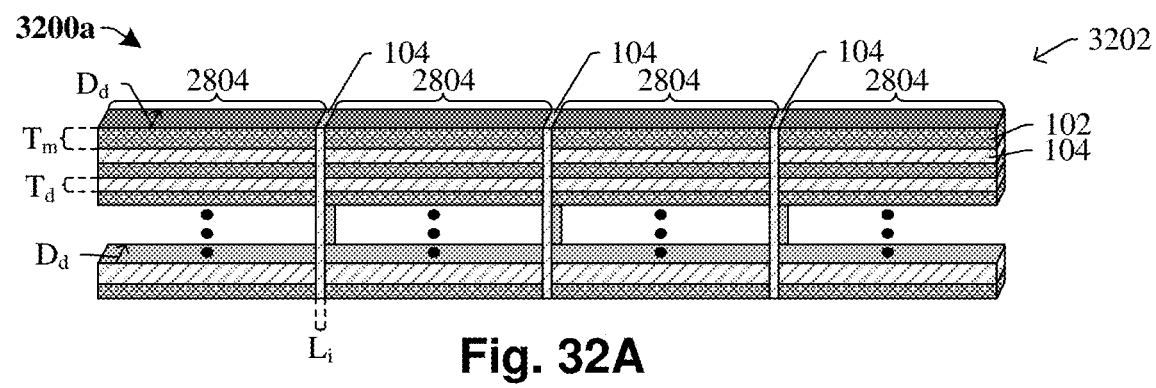

As illustrated by the perspective view, with the front portions removed, 3200a of FIG. 32A, the plurality of M first multilayer sheet 2804 and M-1 adhesive laminated dielectric layers 104 are tailored (or cut) along the second cut line (3102 of FIG. 31) defining a third multilayer sheet 3202. The distance $D_d$ defines a width of the third multilayer sheet 3202.

Figure 32B:
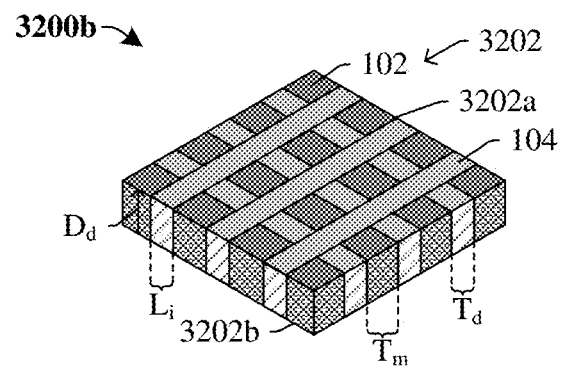

As illustrated by the perspective view, with the front portions removed, 3200b of FIG. 32B, the third multilayer sheet 3202 (of FIG. 32A) is rotated 90 degrees. A top surface 3202a of the third multilayer sheet 3202 comprises a top surface of a plurality of rectangles of the magnetic layer 102 and dielectric layer 104 and a plurality of strips of the dielectric layer 104. A bottom surface 3202b of the third multilayer sheet 3202 comprises a bottom surface of a plurality of rectangles of the magnetic layer 102 and dielectric layer 104 and a plurality of strips of the dielectric layer 104. In some embodiments, the plurality of rectangles of the magnetic layer 102 and dielectric layer 104 comprises at least nine rectangles respectively. In some embodiments, the plurality of strips of the dielectric layer 104 comprises at least three strips. In some embodiments, the third multilayer sheet 3202 defines the third multilayer stack 103c.

With reference to FIGS. 33, 34, 35A-35C, and 36A-36C, cross-sectional views 3300, 3400, 3500a, 3500b, 3500c, 3600a, 3600b, and 3600c of various embodiments of a method for forming a magnetic field shielding structure are provided. The method is illustrated using embodiments of the memory device in FIGS. 3A-3B and 4A-4B. Notwithstanding this, the method may be used to form embodiments of the memory device in any one of FIGS. 5A-5C, 6A-6C, 7A-7C, 8A-8C, 9A-9C, 10A-10C, 11A-11C, 12A-12C, 13A-13C, 14A-14C, 15A-15C, 16A-16C, 17A-17C, 18A-18C, 19A-19C, 20A-20C, 21A-21C, 22A-22C, 23A-23C, 24A-24C, 25A-25C, and 26A-26C. Additionally, as seen hereafter, FIGS. 33, 34, 35A-35C, and 36A-36C correspond to a method for forming the magnetic field shielding structure 105 comprising the first multilayer stack 103a, second multilayer stack 103b, or the third multilayer stack 130c.

Although the cross-sectional views 3300, 3400, 3500a, 3500b, 3500c, 3600a, 3600b, and 3600c shown in FIGS. 33, 34, 35A-35C, and 36A-36C are described with reference to a method, it will be appreciated that the structures shown in FIGS. 33, 34, 35A-35C, and 36A-36C are not limited to the method but rather may stand alone separate of the method. Although FIGS. 33, 34, 35A-35C, and 36A-36C are described as a series of acts, it will be appreciated that these acts are not limiting in that the order of the acts can be altered in other embodiments, and the methods disclosed are also applicable to other structures. In other embodiments, some acts that are illustrated and/or described may be omitted in whole or in part.

Figure 33:
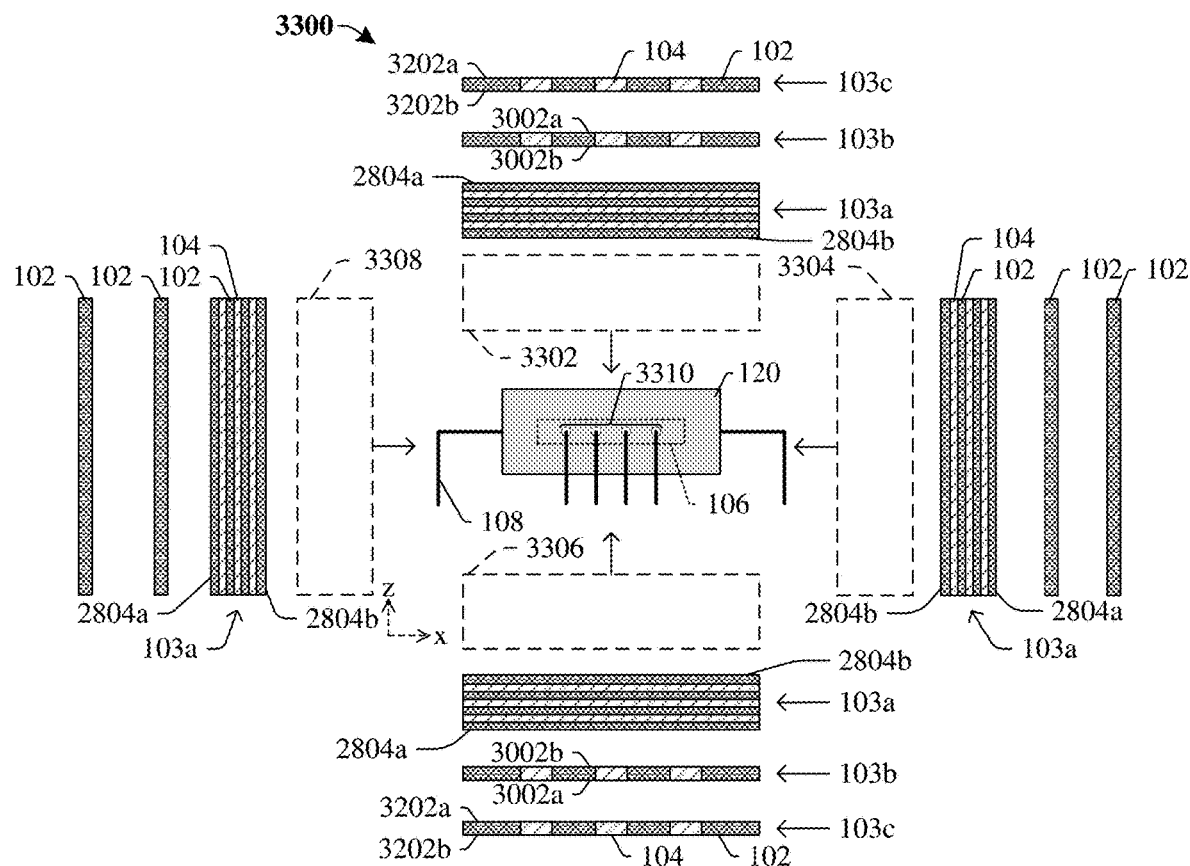

As illustrated by the cross-sectional view 3300 of FIG. 33 in the z-x plane, the chip 106 is enveloped by the insulating structure 120. A plurality of holes are defined in the insulating structure 120 outside a sidewall region of the chip 106. The electric connectors 108 extend through the plurality of holes. A top area 3302 is defined above a top surface of the chip 106. A bottom area 3306 is defined above a bottom surface of the chip 106. A first sidewall area 3304 and a second sidewall area 3308 are defined laterally offset from the sidewall region of the chip 106. A plurality of first, second, or third multilayer stack 103a, 103b, 103c respectively is formed. A top multilayer stack of the plurality of first, second, or third multilayer stack 103a, 103b, 103c is tailored to meet dimensions of the top surface of the chip 106 and/or insulating structure 120 and is placed in the top area 3302. A bottom multilayer stack of the plurality of first, second, or third multilayer stack 103a, 103b, 103c is tailored to meet dimensions of the bottom surface of the chip 106 and/or insulating structure 120 and is placed in the bottom area 3306. A first sidewall stack of the first multilayer stack 103a or the magnetic layer 102 is tailored to meet dimensions of a first sidewall of the chip 106 and/or insulating structure 120 and is placed in the first sidewall area 3304. A second sidewall stack of the first multilayer stack 103a or the magnetic layer 102 is tailored to meet dimensions of a second sidewall of the chip 106 and/or insulating structure 120 and is placed in the second sidewall area 3308.

Figure 34:
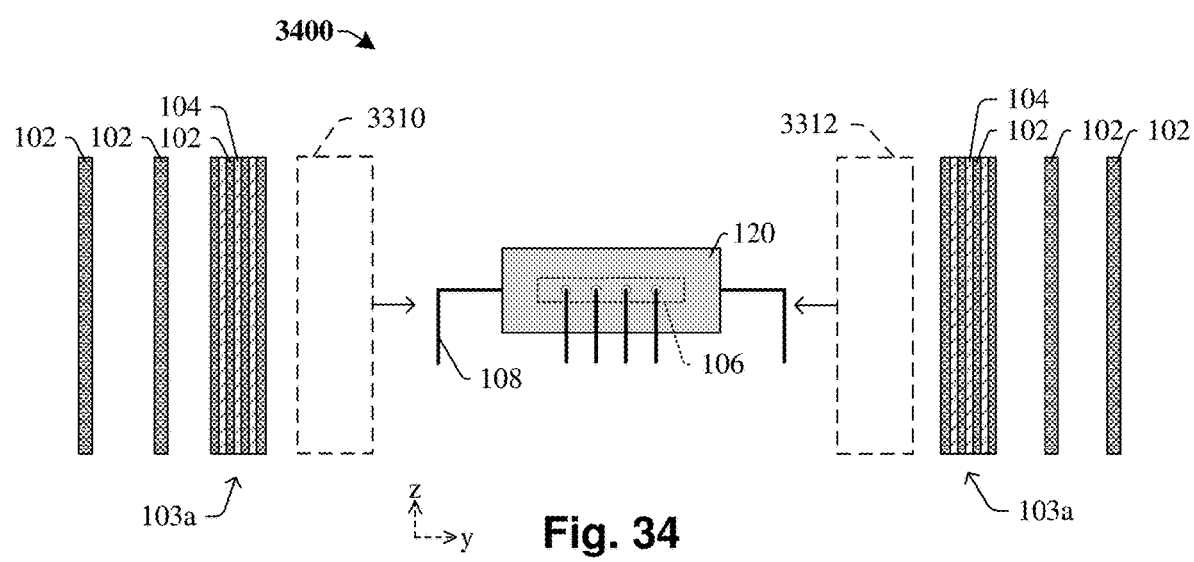

Referring to FIG. 34, a cross-sectional view 3400 of some embodiments of the memory device of FIG. 33 in the z-y plane, in which a third sidewall area 3310 and a fourth sidewall area 3312 are defined laterally offset from the sidewall region of the chip 106. A third sidewall stack of the first multilayer stack 103a or the magnetic layer 102 is tailored to meet dimensions of a third sidewall of the chip 106 and/or insulating structure 120 and is placed in the third sidewall area 3310. A fourth sidewall stack of the first multilayer stack 103a or the magnetic layer 102 is tailored to meet dimensions of a fourth sidewall of the chip 106 and/or insulating structure 120 and is placed in the fourth sidewall area 3312. A stack respectively in the top area 3302, bottom area 3306, first sidewall area 3304, second sidewall area 3308, third sidewall area 3310, and fourth sidewall area 3312 is respectively attached to the respective surface of the chip 106 or insulating structure 120. In some embodiments, the first sidewall stack, second sidewall stack, third sidewall stack, and fourth sidewall stack respectively comprise a plurality of holes or openings tailored to the electric connectors 108.

As illustrated by the cross-sectional views 3500a-3500c of FIGS. 35A-35C in the z-x plane, the top multilayer stack, bottom multilayer stack, first sidewall stack, second sidewall stack, third sidewall stack, and fourth sidewall stack are respectively glued/attached to the top surface, bottom surface, first sidewall, second sidewall, third sidewall, and fourth sidewall of the insulating structure 120 defining the magnetic shielding structure 105.

As illustrated by the cross-sectional views 3600a-3600c of FIGS. 36A-36C in the z-x plane, the insulating structure 120 is formed around an outer surface of the magnetic shielding structure 105 defining a package structure 121.

Figure 37:
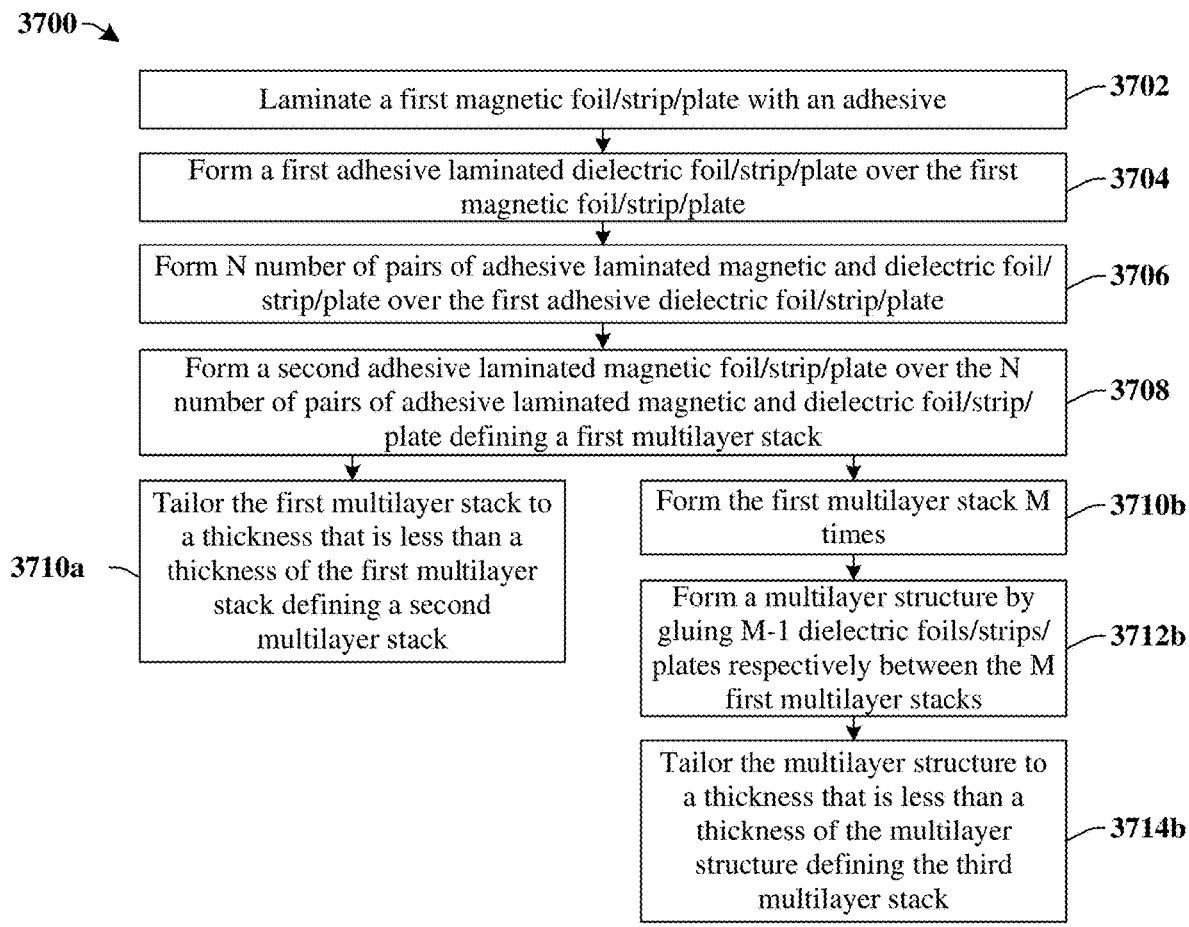
FIG. 37 illustrates a block diagram of some embodiments of the method of FIGS. 27, 28A, 28B, 29, 30A, 30B, 31, 32A, and 32B.

With reference to FIG. 37, a block diagram 3700 of some embodiments of a method 3700 for the method of FIGS. 27, 28A, 28B, 29, 30A, 30B, 31, 32A, and 32B is provided.

At 3702, a first magnetic foil/strip/plate is laminated with an adhesive. FIG. 27 illustrates a cross-sectional view 2700 corresponding to some embodiments of act 3702.

At 3704, a first adhesive laminated dielectric foil/strip/plate is formed over the first magnetic foil/strip/plate. FIG. 27 illustrates a cross-sectional view 2700 corresponding to some embodiments of act 3704.

At 3706, N number of pairs of adhesive laminated magnetic and dielectric foil/strip/plate are formed over the first adhesive dielectric foil/strip/plate (N is a whole number greater than or equal to 1). FIGS. 28A and 28B illustrate cross-sectional views 2800a and 2800b corresponding to some embodiments of act 3706.

At 3708, a second adhesive laminated magnetic foil/strip/plate is formed over the N number of pairs of adhesive laminated magnetic and dielectric foil/strip/plate defining a first multilayer stack. FIGS. 28A and 28B illustrate cross-sectional views 2800a and 2800b corresponding to some embodiments of act 3708.

At 3710a, the first multilayer stack is tailored or cut to a thickness that is less than a thickness of the first multilayer stack defining a second multilayer stack. FIGS. 29, 30A, and 30B illustrate cross-sectional views 2900, 3000a, and 3000b corresponding to some embodiments of act 3710a.

At 3710b, the first multilayer stack is formed M times. FIG. 31 illustrates a cross-sectional view 3100 corresponding to some embodiments of act 3710b.

At 3712b, a multilayer structure is formed by gluing M-1 dielectric foils/strips/plates respectively between the M first multilayer stacks. FIG. 31 illustrates a cross-sectional view 3100 corresponding to some embodiments of act 3712b.

At 3714b, the multilayer structure is tailored or cut to a thickness that is less than a thickness of the multilayer structure defining the third multilayer stack. FIGS. 32A and 32B illustrate cross-sectional views 3200a and 3200b corresponding to some embodiments of act 3714b.

Figure 38:
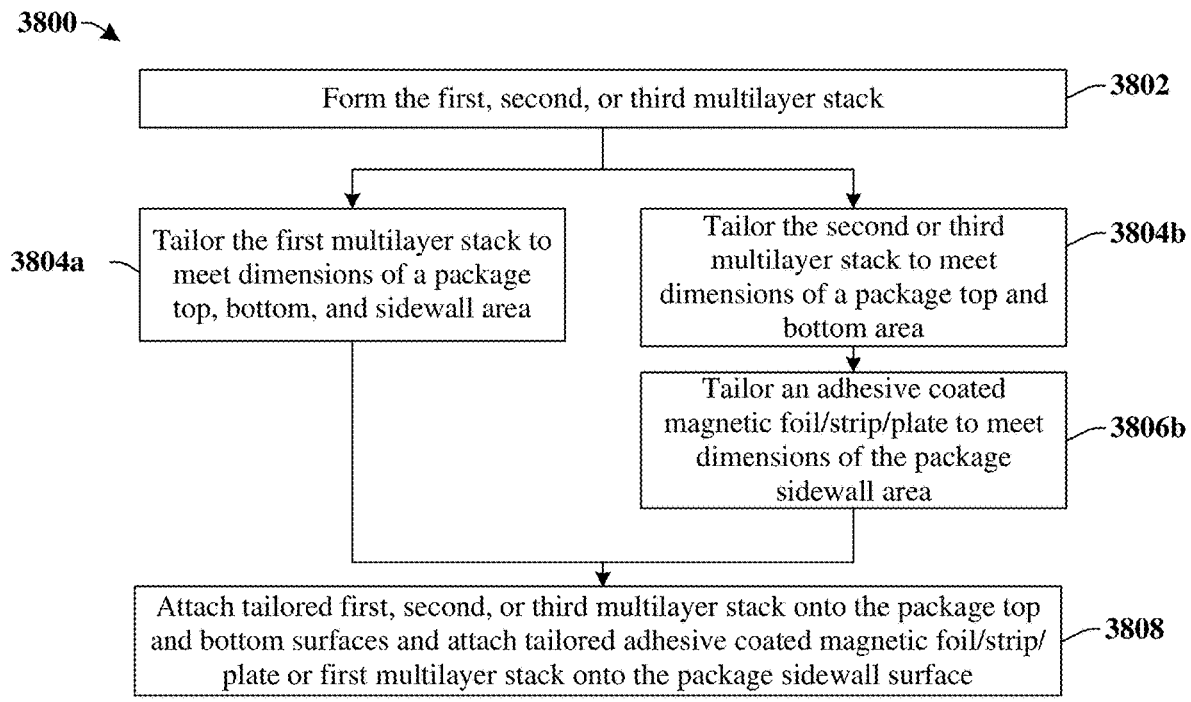
FIG. 38 illustrates a block diagram of some embodiments of the method of FIGS. 33, 34, 35A-35C, and 36A-36C.

With reference to FIG. 38, a block diagram 3800 of some embodiments of a method 3800 for the method of FIGS. 33, 34, 35A-35C, and 36A-36C is provided.

At 3802, the first, second, or third multilayer stack is formed. FIG. 33 illustrates a cross-sectional view 3300 corresponding to some embodiments of act 3802.

At 3804a, the first multilayer stack is tailored or cut to meet dimensions of a package top, bottom, and sidewall area. FIGS. 33 and 34 illustrate cross-sectional views 3300 and 3400 corresponding to some embodiments of act 3804a.

At 3804b, the second or third multilayer stack are tailored or cut to meet dimensions of a package top and bottom area. FIGS. 33 and 34 illustrate cross-sectional views 3300 and 3400 corresponding to some embodiments of act 3804b.

At 3806b, adhesive coated magnetic foil/strip/plate is tailored or cut to meet dimensions of the package sidewall area. FIGS. 33 and 34 illustrate cross-sectional views 3300 and 3400 corresponding to some embodiments of act 3806b.

At 3808, tailored first, second, or third multilayer stack are attached onto the package top and bottom surfaces and tailored adhesive coated magnetic foil/strip/plate or first multilayer stack are attached onto the package sidewall surface. FIGS. 33 and 34 illustrate cross-sectional views 3300 and 3400 corresponding to some embodiments of act 3808.

Accordingly, in some embodiments, the present application relates to a magnetic field shielding structure comprising a magnetic and dielectric layer at least partially surrounding a chip.

In some embodiments, the present application provides a memory device including: a chip including a magnetoresistive random access memory (MRAM) cell; and a magnetic field shielding structure at least partially surrounding the chip and comprising a magnetic layer and a dielectric layer.

In some embodiments, the present application provides memory device including: a chip including a magnetoresistive random access memory (MRAM) cell; the chip comprises an upper face, a bottom face, and sidewalls extending between the upper face and the bottom face; a magnetic field shielding structure at least partially surrounding the chip comprising a multilayer stack; the multilayer stack is comprised of a magnetic layer and a dielectric layer; the magnetic field shielding structure comprises a top region above the upper face of the chip; a bottom region below the bottom face of the chip, and a sidewall region laterally surrounding the sidewalls of the chip; openings exists in the sidewall region of the magnetic field shielding structure; electric connectors extend through the openings and couple to the chip; a first magnetic region is located inside an inner surface of the magnetic field shielding structure and a second magnetic region is located immediately outside an outer surface of the magnetic field shielding structure; and a magnetic field in the first magnetic region is less than a magnetic field in the second magnetic region.

In some embodiments, the present application provides a method for manufacturing a memory device, the method including: forming one or more multilayer stacks, the multilayer stack comprises a magnetic layer and a dielectric layer; forming one or more magnetic layers; tailoring the one or more multilayer stacks and the one or more magnetic layers to meet dimensions of a package structure; the package structure comprises a chip including a magnetoresistive random access memory (MRAM) cell and an insulating material enveloping the chip; an outer surface of the package structure comprises the insulating material; and attaching the tailored one or more multilayer stacks and the tailored one or more magnetic layers to the outer surface of the package structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A memory device comprising:
a chip including a magnetoresistive random access memory (MRAM) cell; and
a magnetic field shielding structure at least partially surrounding the chip and comprising a magnetic layer and a dielectric layer, wherein the magnetic field shielding structure comprises a top region over an upper surface of the chip, a bottom region below a lower surface of the chip, and a sidewall region extending between the top region and the bottom region, wherein conductive wires extend through openings in the sidewall region and couple to the chip, wherein the conductive wires respectively comprise a lateral segment extending in a first direction from outside the sidewall region towards a sidewall of the chip and a vertical segment extending from the lateral segment in a second direction towards a substantially horizontal line that is aligned with a bottom surface of the magnetic field shielding structure, and wherein the vertical segment is laterally offset from an outer surface of the magnetic field shielding structure in a direction away from the sidewall of the chip.

2. The memory device of claim 1, wherein the magnetic field shielding structure comprises:
a first multilayer stack disposed in the top region; and
a second multilayer stack disposed in the bottom region, wherein the second multilayer stack is identical to the first multilayer stack.

3. The memory device of claim 2, wherein the sidewall region is made of magnetic material extending between the first multilayer stack and the second multilayer stack.

4. The memory device of claim 1, further comprising:
an insulating adhesive disposed over the magnetic layer and the dielectric layer;
wherein the magnetic layer is a sheet of continuous magnetic material arranged in the top region, the sheet of continuous magnetic material having a length and a width which are greater than a length and a width, respectively, of the upper surface of the chip; and
wherein the dielectric layer is a sheet of continuous dielectric material arranged over the sheet of continuous magnetic material, the sheet of continuous dielectric material having a length and a width which are greater than the length and the width, respectively, of the upper surface of the chip.

5. The memory device of claim 1, wherein the magnetic field shielding structure comprises:
a plurality of strips of magnetic material arranged in the top region, each strip of magnetic material having a length greater than a length of the upper surface of the chip and having a width less than a width of the upper surface of the chip; and
a plurality of strips of dielectric material arranged in the top region and separating the plurality of strips of magnetic material from one another, each strip of dielectric material having a length that is greater than the length of the upper surface of the chip and having a width that is less than the width of the upper surface of the chip.

6. The memory device of claim 1:
wherein the magnetic layer comprises a plurality of magnetic regions that are spaced apart from one another in a series of rows and columns in the top region, and
wherein the dielectric layer comprises a plurality of linear segments of dielectric material which perpendicularly intersect one another to form a grid, wherein the magnetic regions are arranged within the grid such that neighboring magnetic regions are apart from one another by at least one linear segment of dielectric material, the dielectric layer has a length and a width which are greater than a length and a width, respectively, of the upper surface of the chip.

7. The memory device of claim 1, further comprising:
insulating material enveloping the chip defining a package structure, wherein there is a non-zero distance between an outer surface of the package structure and an inner surface of the magnetic field shielding structure, wherein the magnetic field shielding structure at least partially surrounds the package structure.

8. The memory device of claim 1, further comprising:
insulating material enveloping the chip and the magnetic field shielding structure, wherein the insulating material is disposed between an outer surface of the chip and an inner surface of the magnetic field shielding structure, wherein an outer surface of the insulating material is outside of an outer surface of the magnetic field shielding structure; and
wherein the conductive wires extend through the insulating material to electrically couple the chip to a lead frame configured to be mounted to a printed circuit board (PCB).

9. The memory device of claim 1, wherein the chip comprises six surfaces, wherein the magnetic field shielding structure covers at least a first set of two of the six surfaces and leaves a second set of two of the six surfaces exposed to magnetic fields, the first set of two of the six surfaces are parallel, wherein the magnetic field shielding structure shields the first set of two of the six surfaces from magnetic fields.

10. A memory device comprising:
a chip including a magnetoresistive random access memory (MRAM) cell, wherein the chip comprises an upper face, a bottom face and sidewalls extending between the upper face and the bottom face; and
a magnetic field shielding structure at least partially surrounding the chip comprising a multilayer stack, the multilayer stack is comprised of two or more a magnetic layers and two or more dielectric layers, wherein the magnetic field shielding structure comprises a top region above the upper face of the chip, a bottom region below the bottom face of the chip, and a sidewall region laterally surrounding the sidewalls of the chip, wherein openings exists in the sidewall region of the magnetic field shielding structure, electric connectors extend through the openings and couple to the chip, wherein a first magnetic region is located inside an inner surface of the magnetic field shielding structure and a second magnetic region is located immediately outside an outer surface of the magnetic field shielding structure, a magnetic field in the first magnetic region is less than a magnetic field in the second magnetic region.

11. The memory device of claim 10, wherein the magnetic field in the second magnetic region is 80 percent greater than the magnetic field in the first magnetic region.

12. The memory device of claim 10, wherein a pair of layers comprises an individual magnetic layer from the two or more magnetic layers disposed over an individual dielectric layer from the two or more dielectric layers, the multilayer stack is comprised of two or more of the pair of layers disposed over the chip and an insulating adhesive, wherein a length and a width of the individual magnetic layer is greater than a length and a width of the upper face of the chip.

13. The memory device of claim 12, wherein the top region, bottom region, and sidewall region comprise the multilayer stack.

14. The memory device of claim 10, wherein a pair of layers comprises an individual magnetic layer from the two or more magnetic layers disposed laterally next to an individual dielectric layer from the two or more dielectric layers, the multilayer stack is comprised of three or more of the pair of layers, wherein a length of the individual magnetic layer is greater than a length of the upper face of the chip, wherein a width of the individual magnetic layer is less than a width of the upper face of the chip, wherein a length and width of the multilayer stack is greater than the length and width of the upper face of the chip.

15. The memory device of claim 14, wherein the top region and the bottom region comprise the multilayer stack, wherein the sidewall region comprises a magnetic material.

16. The memory device of claim 10, wherein the multilayer stack is comprised of a plurality of rectangles of the magnetic layers, every rectangle in the plurality of rectangles is separated by the dielectric layers, wherein a length and width of the multilayer stack is greater than a length and width of the upper face of the chip.

17. The memory device of claim 16, wherein the top region and the bottom region comprise the multilayer stack, wherein the sidewall region comprises one or more of magnetic layers.

18. A memory device comprising:
- a chip including a magnetoresistive random access memory (MRAM) cell, wherein the chip comprises an upper surface, a lower surface, and sidewalls extending between the upper surface and the lower surface;
- an insulating structure disposed around the chip, wherein the insulating structure continuously extends from the upper surface of the chip, along the sidewalls of the chip, to the lower surface of the chip;
- a magnetic field shielding structure at least partially surrounding the chip, wherein the magnetic field shielding structure comprises:
  - an upper multilayer stack disposed a first distance above the upper surface of the chip;
  - a lower multilayer stack disposed the first distance below the lower surface of the chip, wherein the upper multilayer stack and the lower multilayer stack respectively comprise two or more magnetic layers and two or more dielectric layers;
  - a sidewall region made of magnetic material and extending between the upper multilayer stack and the lower multilayer stack, wherein the sidewall region laterally surrounds the sidewalls of the chip and is disposed the first distance from the sidewalls of the chip, wherein openings exists in the sidewall region of the magnetic field shielding structure; and
- electrical connectors extending through the openings of the sidewall region and the insulating structure to the chip, wherein the electrical connectors are electrically coupled to the MRAM cell.

19. The memory device of claim 18, wherein the openings in the sidewall region of the magnetic field shielding structure are vertically aligned with sidewalls of the chip.

20. The memory device of claim 18, wherein each dielectric layer is spaced between adjacent magnetic layers.

* * * * *